United States Patent
In et al.

(10) Patent No.: US 8,435,648 B2
(45) Date of Patent: May 7, 2013

(54) PYRIDINYLENE RING COMPOUND FOR ORGANIC OPTOELECTRONIC DEVICE, ORGANIC LIGHT EMITTING DIODE INCLUDING THE SAME AND DISPLAY INCLUDING THE ORGANIC LIGHT EMITTING DIODE

(75) Inventors: Kyu-Yeol In, Uiwang-si (KR); Myeong-Soon Kang, Uiwang-si (KR); Ho-Kuk Jung, Uiwang-si (KR); Nam-Soo Kim, Uiwang-si (KR); Eui-Su Kang, Uiwang-si (KR); Mi-Young Chae, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/173,381

(22) Filed: Jun. 30, 2011

(65) Prior Publication Data

US 2011/0284832 A1    Nov. 24, 2011

Related U.S. Application Data

(63) Continuation of application No. PCT/KR2009/007411, filed on Dec. 10, 2009.

(30) Foreign Application Priority Data

Dec. 30, 2008  (KR) ......................... 10-2008-0137223

(51) Int. Cl.
   *H01L 51/54* (2006.01)
   *C09K 11/06* (2006.01)

(52) U.S. Cl.
   USPC .............. 428/690; 428/917; 257/40; 546/140

(58) Field of Classification Search .................... None
   See application file for complete search history.

(56) References Cited

U.S. PATENT DOCUMENTS

| | | | |
|---|---|---|---|
| 2006/0035109 A1* | 2/2006 | Arakane et al. | 428/690 |
| 2006/0186796 A1 | 8/2006 | Yabe et al. | |
| 2007/0200490 A1* | 8/2007 | Kawamura et al. | 313/504 |
| 2007/0257600 A1 | 11/2007 | Matsuura et al. | |
| 2009/0102361 A1 | 4/2009 | Miki et al. | |
| 2010/0249406 A1* | 9/2010 | Yamakawa et al. | 544/216 |

FOREIGN PATENT DOCUMENTS

| | | |
|---|---|---|
| CN | 1833470 A | 9/2006 |
| JP | 2004-31004 A | 1/2004 |
| JP | 2005-255986 | 9/2005 |
| JP | 2005-268199 | 9/2005 |
| JP | 2005-276801 A | 10/2005 |
| JP | 2007-088433 | 4/2007 |
| KR | 10 2006-0096980 A | 9/2006 |
| KR | 10-2006-0114001 A | 11/2006 |
| WO | WO-2007/026847 | 3/2007 |
| WO | WO 2008129912 A1 * | 10/2008 |

OTHER PUBLICATIONS

Fink et al. "Synthesis and Characterization of Aromatic Poly(1,3,5-triazine-ether)s for Electroluminescent Devices" Macromolecules 1997, 30, 8177-8181. Year of publication: 1997.*

Chihaya Adachi et al.—Electroluminescence in Organic Films, etc.. Japanese Journal of Applied Physics, vol. 27, No. 2, Feb. 1988, pp. L269-L271.

European Search Report dated Feb. 21, 2013.

* cited by examiner

*Primary Examiner* — Jennifer Chriss
*Assistant Examiner* — Andrew K Bohaty
(74) *Attorney, Agent, or Firm* — Lee & Morse, P.C.

(57) ABSTRACT

A compound for an organic photoelectric device, the compound being represented by the following Chemical Formula 1:

[Chemical Formula 1]

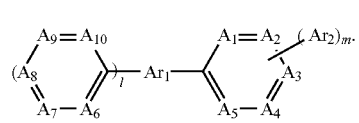

15 Claims, 12 Drawing Sheets

500

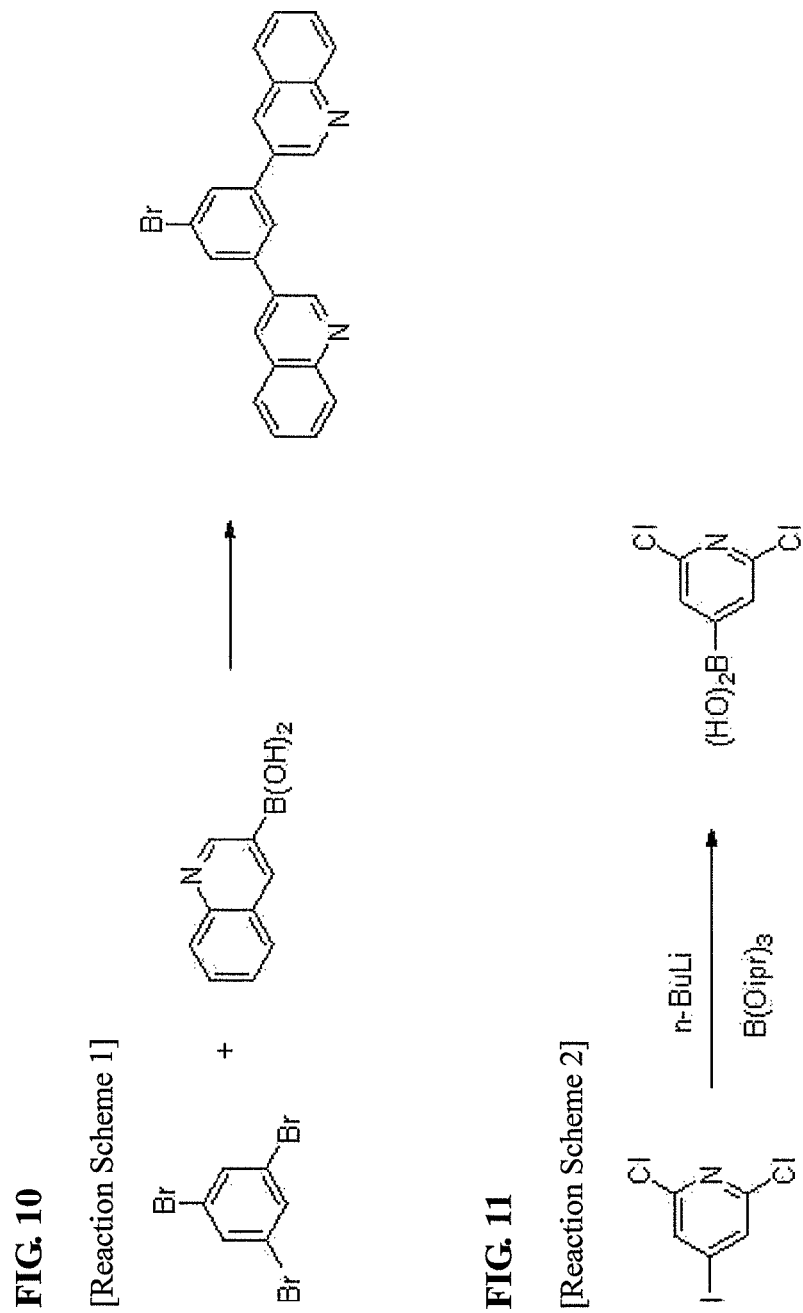
FIG. 10 [Reaction Scheme 1]
FIG. 11 [Reaction Scheme 2]

[Reaction Scheme 3]

[Reaction Scheme 4]

[Reaction Scheme 5]

[Reaction Scheme 6]

[Reaction Scheme 7]

[Reaction Scheme 8]

[Reaction Scheme 9]

PYRIDINYLENE RING COMPOUND FOR ORGANIC OPTOELECTRONIC DEVICE, ORGANIC LIGHT EMITTING DIODE INCLUDING THE SAME AND DISPLAY INCLUDING THE ORGANIC LIGHT EMITTING DIODE

CROSS-REFERENCE TO RELATED APPLICATION

This application is a continuation of pending International Application No. PCT/KR2009/007411, entitled "Compound for Organic Optoelectronic Device, Organic Light Emitting Diode Including the Same and Display Including the Organic Light Emitting Diode," which was filed on Dec. 10, 2009, the entire contents of which are hereby incorporated by reference for all purposes.

BACKGROUND

1. Field

Embodiments relate to a compound for an organic optoelectronic device, an organic light emitting diode including the same, and a display including the organic light emitting diode.

2. Description of the Related Art

An organic optoelectronic device may be used to transform electrical energy into light by applying current to an organic light emitting material, and may have a structure in which a functional organic thin layer is interposed between an anode and a cathode. The organic thin layer may include an emission layer, a hole injection layer (HIL), a hole transport layer (HTL), an electron transport layer (ETL), an electron injection layer (EIL), and the like, and may include an electron blocking layer or a hole blocking layer to improve light emitting properties of the emission layer.

An organic optoelectronic device may have similar electrical characteristics to those of light emitting diodes (LEDs), in which holes are injected from an anode and electrons are injected from a cathode, the holes and electrons then moving to opposite electrodes to be recombined to form excitons having high energy. The formed excitons may generate light having a certain wavelength while shifting to a ground state.

SUMMARY

An embodiment is directed to a compound for an organic photoelectric device, the compound being represented by the following Chemical Formula 1:

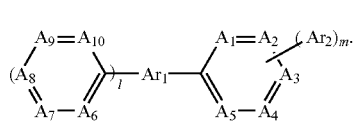

[Chemical Formula 1]

In Chemical Formula 1, $A_1$ to $A_{10}$ may each be independently selected from the group of $CR_1$ to $CR_{10}$, $SiR_1$ to $SiR_{10}$, and N, wherein adjacent ones of $R_1$ to $R_5$ are optionally fused to each other to form a fused ring, and adjacent ones of $R_6$ to $R_{10}$ are optionally fused to each other to form a fused ring, provided that at least one of $A_1$ to $A_5$ is selected from the group of $SiR_1$ to $SiR_5$ and N, or at least one atom of a ring formed by fused ones of adjacent ones of $R_1$ to $R_5$ is a heteroatom, and at least one of $A_6$ to $A_{10}$ is selected from the group of $SiR_6$ to $SiR_{10}$ and N, or at least one atom of a ring formed by fused ones of adjacent ones of $R_6$ to $R_{10}$ is a heteroatom. $R_1$ to $R_{10}$ may each be independently selected from the group of hydrogen, a halogen, a nitrile group, a cyano group, a nitro group, an amide group, a carbonyl group, an ester group, a substituted or unsubstituted alkyl group, a substituted or unsubstituted alkylene group, a substituted or unsubstituted alkoxy group, a substituted or unsubstituted alkenyl group, a substituted or unsubstituted alkenylene group, a substituted or unsubstituted alkynyl group, a substituted or unsubstituted alkynylene group, a substituted or unsubstituted cycloalkyl group, a substituted or unsubstituted cycloalkylene group, a substituted or unsubstituted aryl group, and a substituted or unsubstituted arylene group. $Ar_1$ may be a substituted or unsubstituted arylene group. $Ar_2$ may be a substituted or unsubstituted aryl group. l and m are integers ranging from 1 to 4, wherein, when l is 2 or more such that there are 2 or more l units, each of the 2 or more l units are the same or different, and wherein, when m is 2 or more such that there are 2 or more m units, each of the 2 or more m units are the same or different.

The compound may be represented by the following Chemical Formula 2:

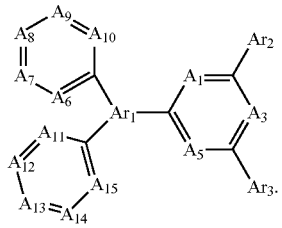

[Chemical Formula 2]

In Chemical Formula 2, $A_1$, $A_3$, $A_5$, and $A_6$ to $A_{15}$ may each be independently selected from the group of $CR_1$, $CR_3$, $CR_5$, $CR_6$ to $CR_{15}$, $SiR_1$, $SiR_3$, $SiR_5$, $SiR_6$, to $SiR_{15}$, and N, wherein the adjacent $R_6$ to $R_{10}$ are optionally fused to each other to form a fused ring, or the adjacent $R_{11}$ to $R_{15}$ are optionally fused to each other to form a fused ring, provided that at least one of $A_1$, $A_3$, and $A_5$ is selected from the group of $SiR_1$, $SiR_3$, $SiR_5$, and N; and at least one of $A_6$ to $A_{10}$ is selected from the group of $SiR_6$ to $SiR_{10}$ and N, or at least one atom of a ring formed by fused ones of adjacent ones of $R_6$ to $R_{10}$ is a heteroatom; and at least one of $A_{11}$ to $A_{15}$ is selected from the group of $SiR_{11}$ to $SiR_{15}$ and N, or at least one atom of a ring formed by adjacent ones of adjacent ones of $R_{11}$ to $R_{15}$ is a heteroatom. $R_1$, $R_3$, $R_5$, and $R_6$ to $R_{15}$ may each be independently selected from the group of hydrogen, a halogen, a nitrile group, a cyano group, a nitro group, an amide group, a carbonyl group, an ester group, a substituted or unsubstituted alkyl group, a substituted or unsubstituted alkylene group, a substituted or unsubstituted alkoxy group, a substituted or unsubstituted alkenyl group, a substituted or unsubstituted alkenylene group, a substituted or unsubstituted alkynyl group, a substituted or unsubstituted alkynylene group, a substituted or unsubstituted cycloalkyl group, a substituted or unsubstituted cycloalkylene group, a substituted or unsubstituted aryl group, and a substituted or unsubstituted arylene group. $Ar_1$ may be a substituted or unsubstituted arylene group. $Ar_2$ and $Ar_3$ may each be independently a substituted or unsubstituted aryl group.

In Chemical Formula 2, at least one of $A_1$, $A_3$, and $A_5$ may be N, and a substituent including $A_6$ to $A_{10}$ and a substituent including $A_{11}$ to $A_{15}$ may be a quinolinyl group or an isoquinolinyl group.

In Chemical Formula 2, $A_6$ may be N, and a substituent including $A_6$ to $A_{10}$ and a substituent including $A_{11}$ to $A_{15}$ may be a quinolinyl group or an isoquinolinyl group.

The quinolinyl group or isoquinolinyl group may be bound with $Ar_1$ at a No. 2 or 3 position of the quinolinyl group or isoquinolinyl group.

$Ar_2$ may be a C6 to C50 aryl.

A fused ring including $A_1$ to $A_5$ and a fused ring including $A_6$ to $A_{10}$ may be a substituted or unsubstituted heterocyclic group when adjacent ones of $R_1$ to $R_5$ are fused to each other to form a fused ring or when adjacent ones of $R_6$ to $R_{10}$ are fused to each other to form a fused ring.

The heterocyclic group may be selected from the group of a thiophenyl group, a furanyl group, a pyrrolyl group, an imidazolyl group, a thiazolyl group, an oxazolyl group, an oxadiazolyl group, a triazolyl group, a carbazolyl group, a pyridinyl group, a pyridazine group, a quinolinyl group, an isoquinolinyl group, an arcidyl group, an imidazopyridinyl group, and an imidazopyrimidinyl group.

A substituent linked to nitrogen (N) of the imidazolyl or triazolyl group may be selected from the group of a substituted or unsubstituted alkyl group, a substituted or unsubstituted cycloalkyl group, a substituted or unsubstituted aryl group, and a substituted or unsubstituted heterocyclic group.

The compound may be a compound selected from the following Chemical Formulae 3 to 17:

[Chemical Formula 3]

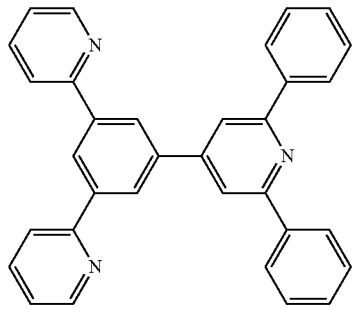

[Chemical Formula 4]

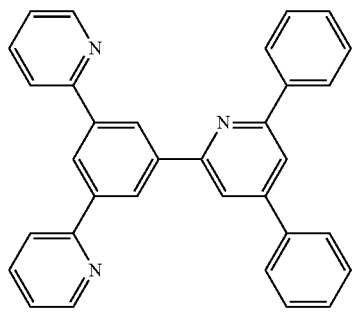

[Chemical Formula 5]

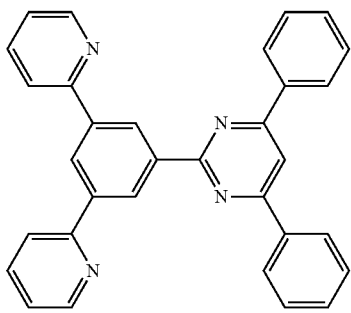

[Chemical Formula 6]

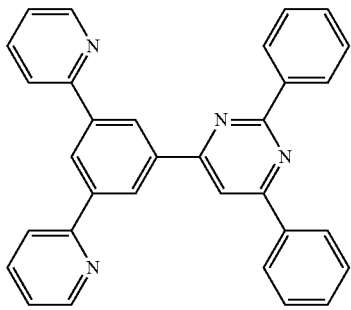

[Chemical Formula 7]

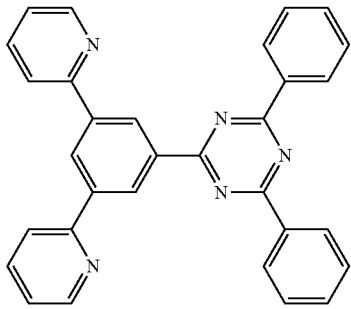

[Chemical Formula 8]

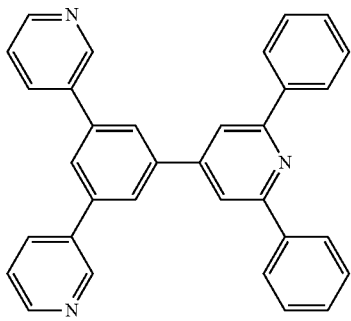

[Chemical Formula 9]

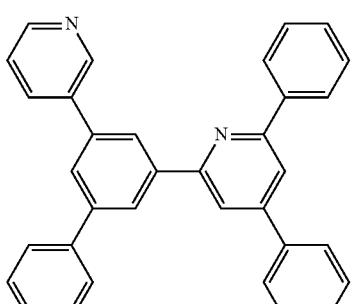

[Chemical Formula 10]
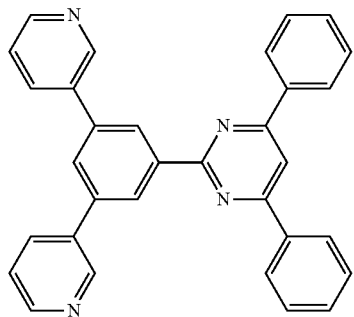
[Chemical Formula 11]
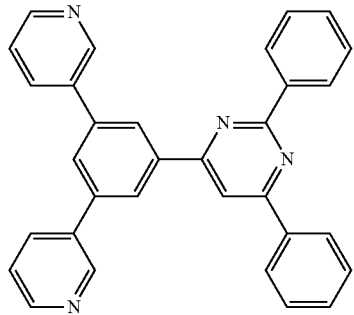
[Chemical Formula 12]
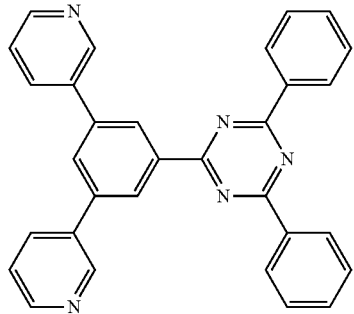
[Chemical Formula 13]
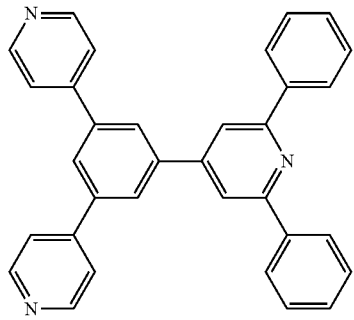
[Chemical Formula 14]
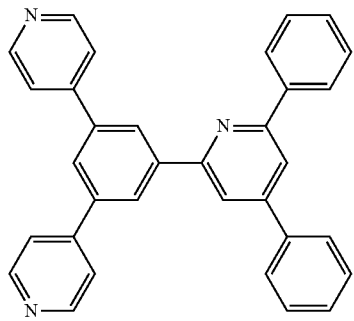
[Chemical Formula 15]
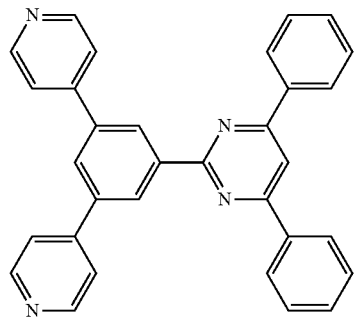
[Chemical Formula 16]
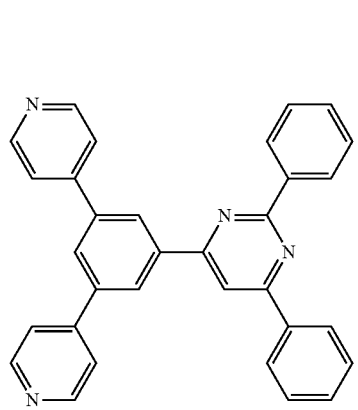
[Chemical Formula 17]
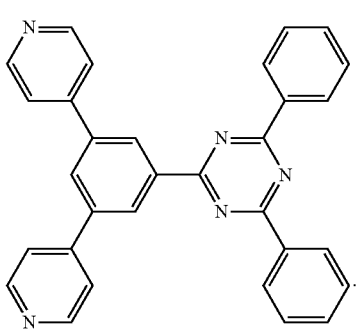
The compound may be a compound selected from the following Chemical Formulae 18, 23, 28, 34, 38, 43, and 48:
[Chemical Formula 18]
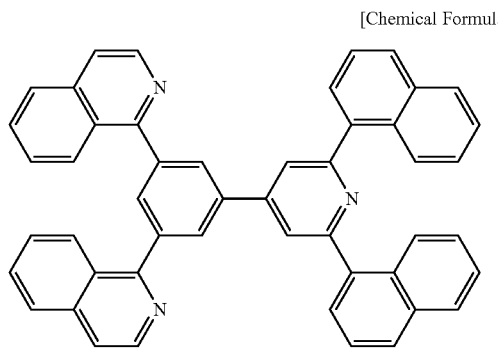

[Chemical Formula 23]
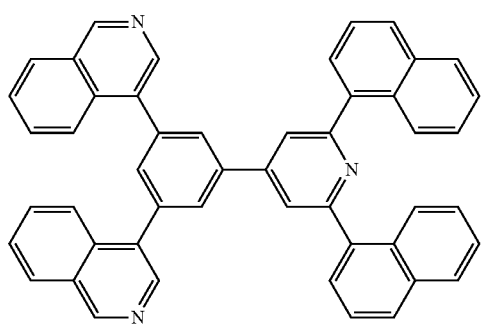
[Chemical Formula 28]
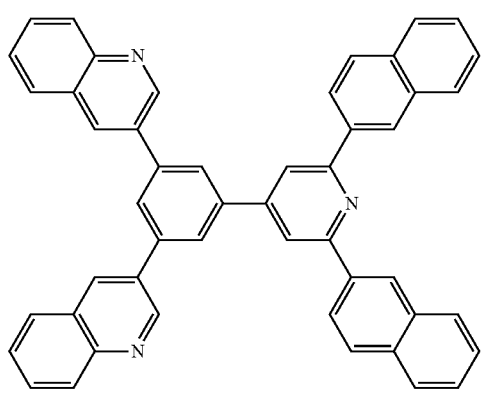
[Chemical Formula 34]
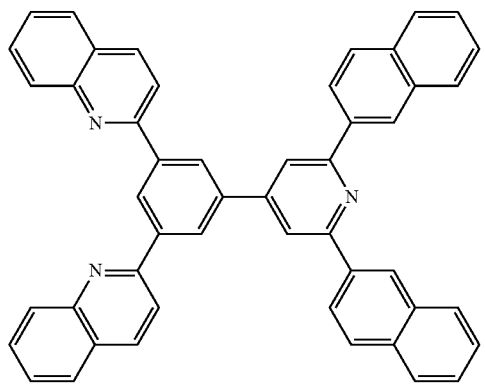
[Chemical Formula 38]
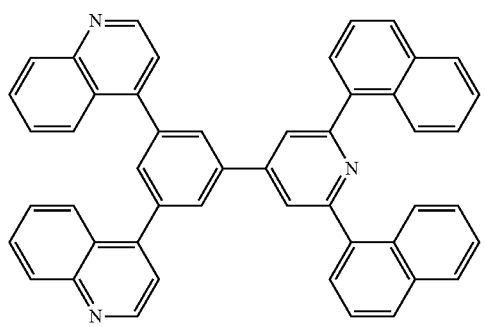
[Chemical Formula 43]
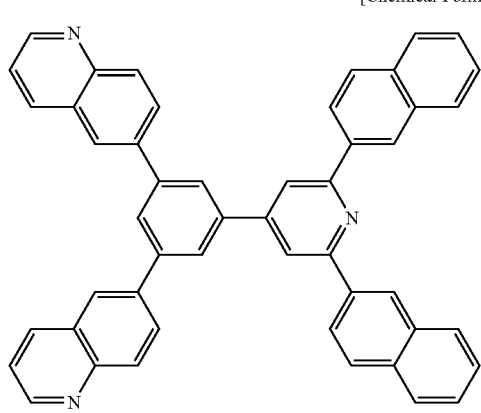
[Chemical Formula 48]
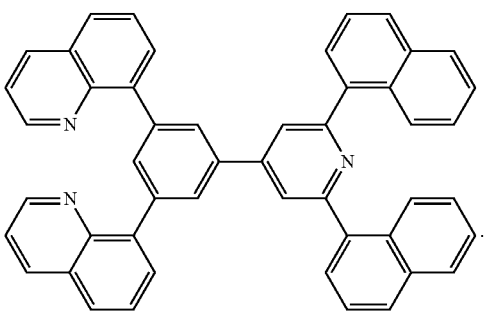
The compound may be a compound selected from the following Chemical Formula Chemical Formulae 19, 24, 29, 35, 39, 44, and 49:
[Chemical Formula 19]
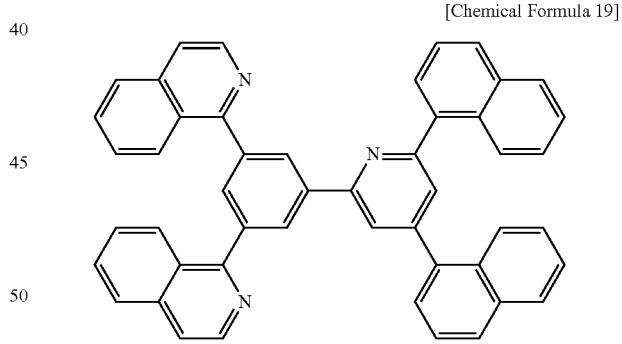
[Chemical Formula 24]
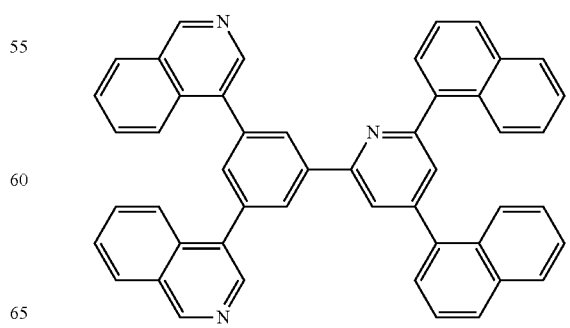

[Chemical Formula 29]
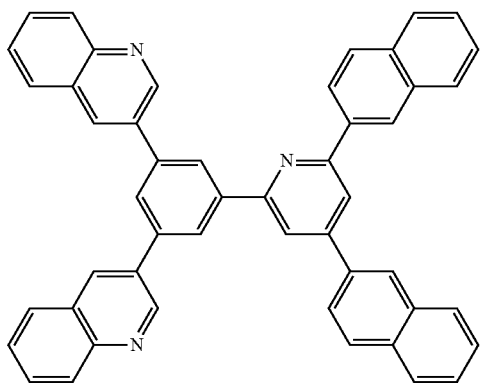
[Chemical Formula 35]
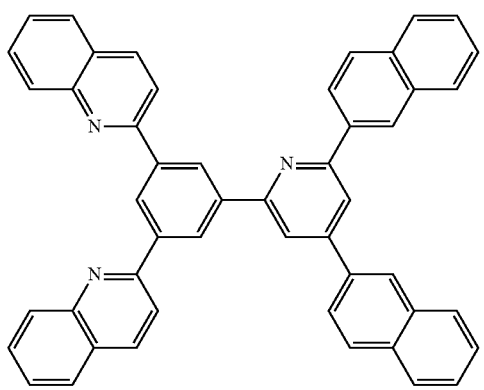
[Chemical Formula 39]
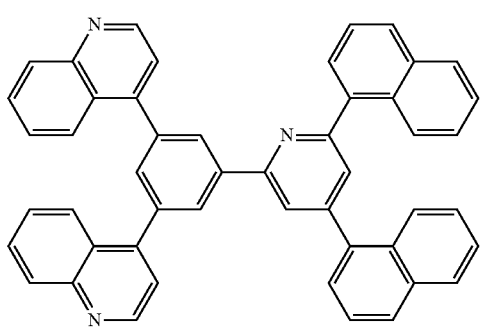
[Chemical Formula 44]
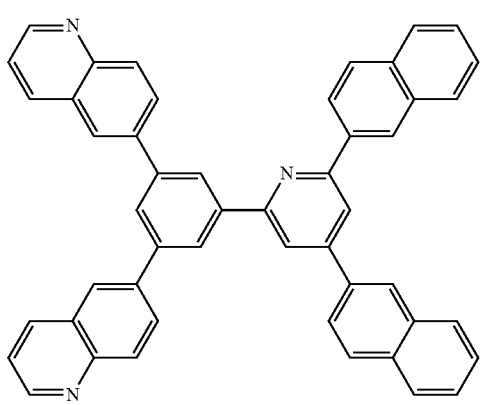
[Chemical Formula 49]
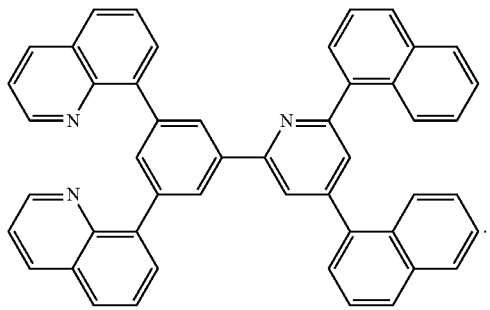
The compound may be a compound selected from the following Chemical Formula Chemical Formulae Chemical Formula 20 to 22, 25 to 27, 30 to 33, 36, 37, 40 to 42, 45 to 47, and 50 to 52:
[Chemical Formula 20]
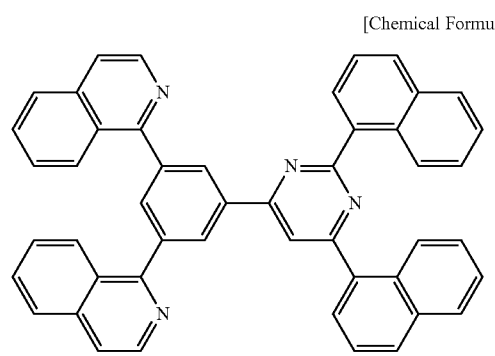
[Chemical Formula 21]
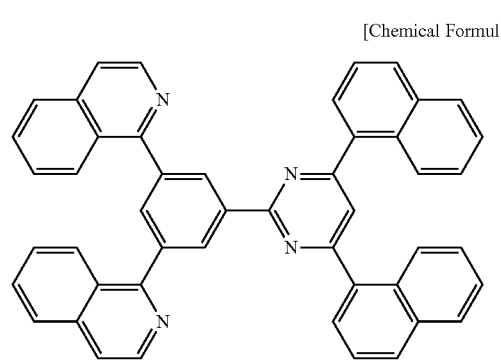
[Chemical Formula 22]
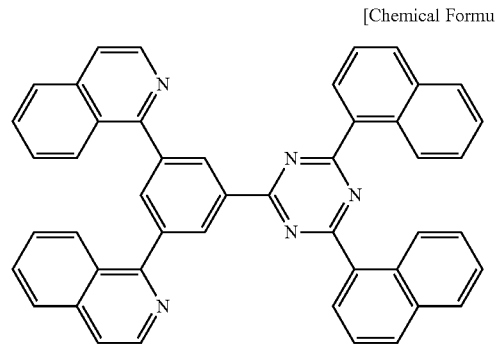

[Chemical Formula 25]
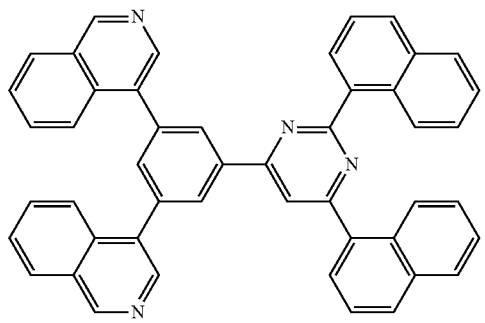
[Chemical Formula 26]
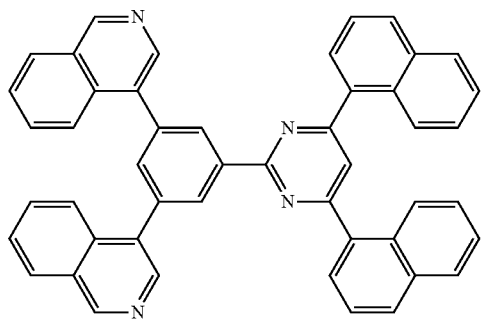
[Chemical Formula 27]
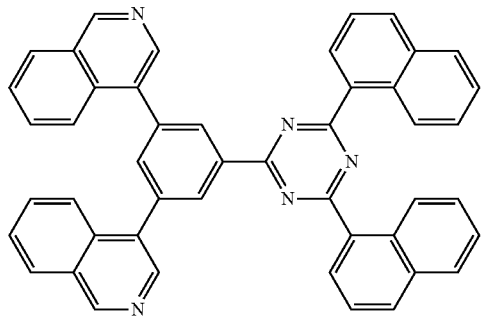
[Chemical Formula 30]
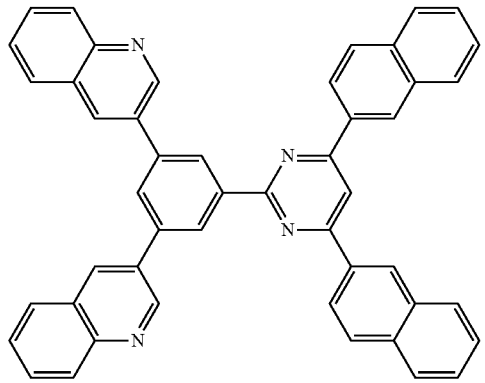
[Chemical Formula 31]
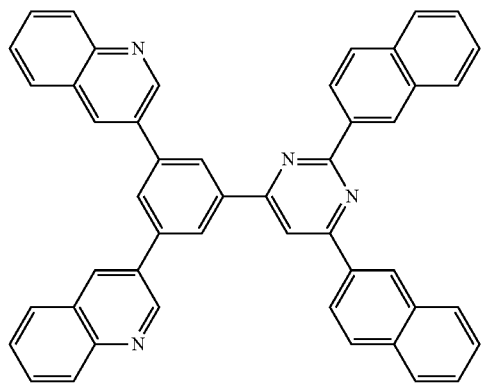
[Chemical Formula 32]
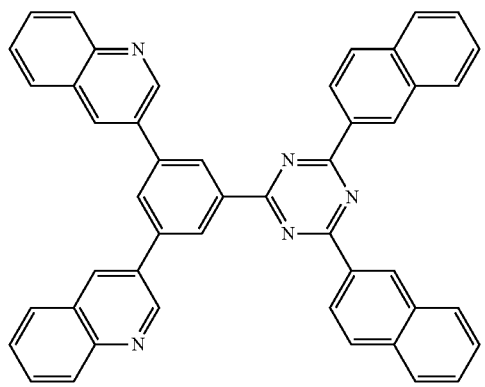
[Chemical Formula 33]
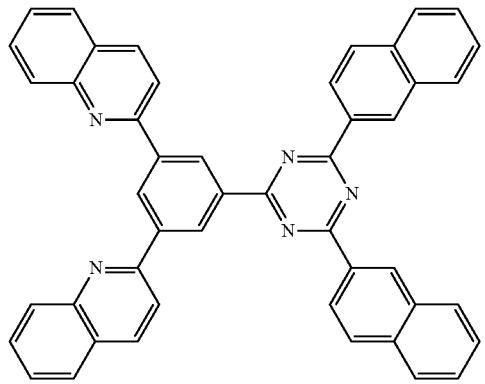
[Chemical Formula 36]
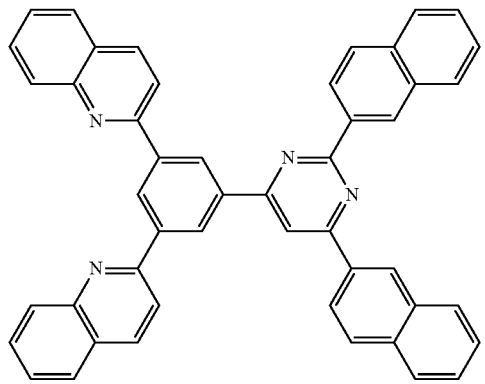

[Chemical Formula 37]
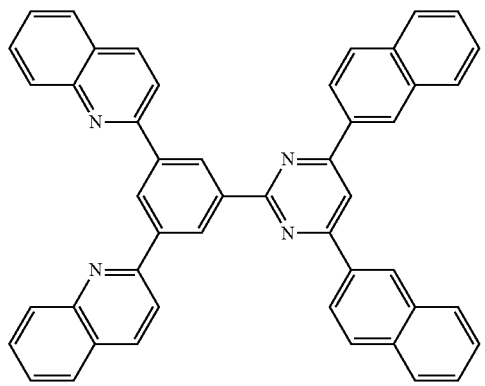
[Chemical Formula 40]
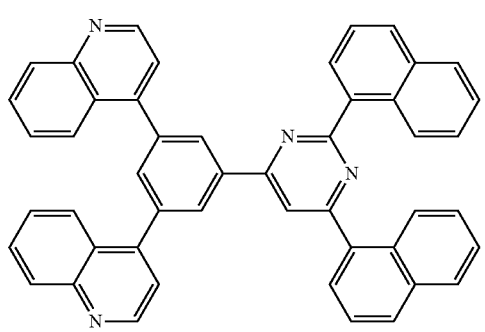
[Chemical Formula 41]
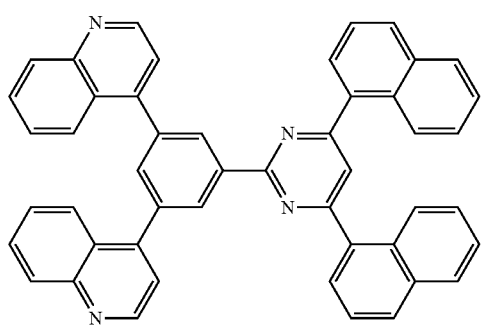
[Chemical Formula 42]
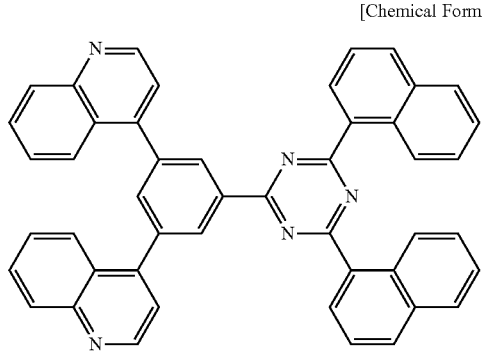
[Chemical Formula 45]
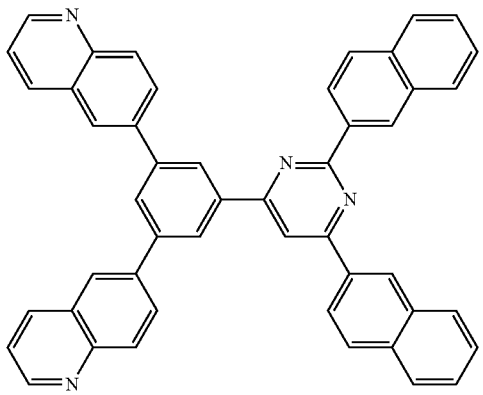
[Chemical Formula 46]
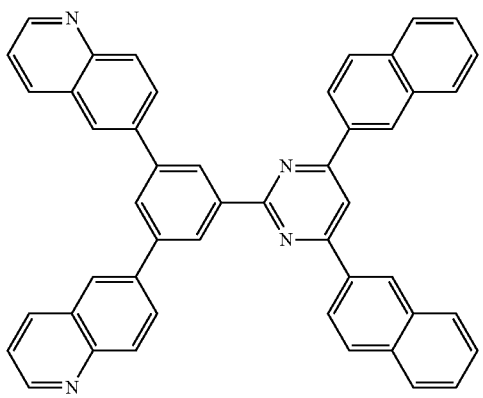
[Chemical Formula 47]
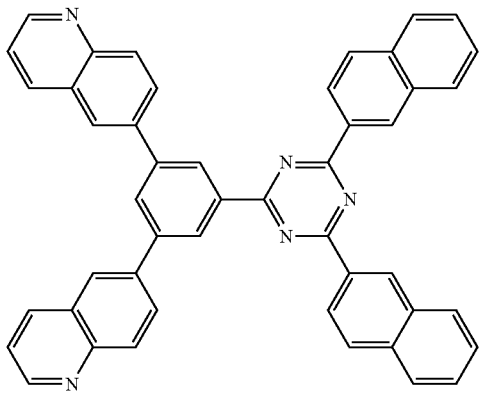
[Chemical Formula 50]
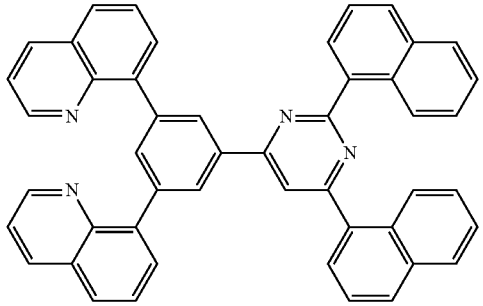

[Chemical Formula 51]

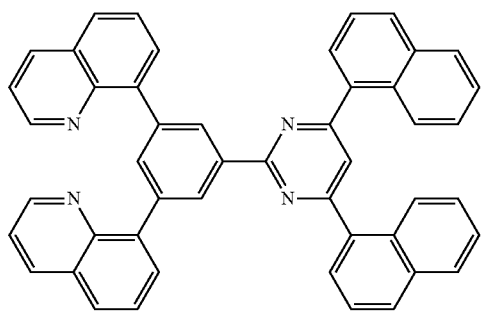

[Chemical Formula 52]

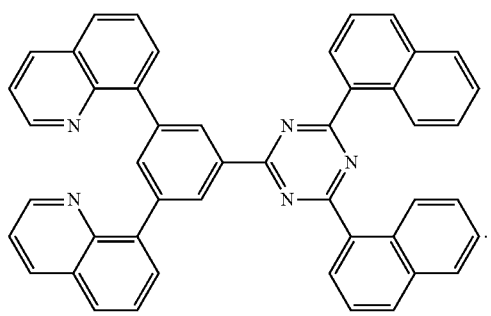

Another embodiment is directed to an organic photoelectric device, including an anode, a cathode, and at least one organic thin layer between the anode and the cathode, the at least one organic thin layer including the compound according to an embodiment.

The compound may be a host material or a charge transport material.

The at least one organic thin layer may include at least one of an emission layer, a hole transport layer, a hole injection layer, an electron transport layer, an electron injection layer, and a combination thereof.

The at least one organic thin layer may include a layer that includes the compound and a reducing dopant.

The reducing dopant may be selected from the group of an alkali metal, an alkali earth metal, a rare earth element metal, an oxide of an alkali metal, a halide of an alkali metal, an organic complex of an alkali metal, an oxide of an alkali earth metal, a halide of an alkali earth metal, an organic complex of an alkali earth metal, an oxide of a rare earth element metal, a halide of a rare earth element metal, and an organic complex of a rare earth element metal.

Another embodiment is directed to a display device comprising an organic photoelectric device according to an embodiment.

BRIEF DESCRIPTION OF THE DRAWINGS

The above and other features and advantages will become more apparent to those of skill in the art by describing in detail example embodiments with reference to the attached drawings, in which:

FIGS. 10-18 illustrate Reaction Schemes 1-9, respectively.

DESCRIPTION OF REFERENCE NUMERALS INDICATING PRIMARY ELEMENTS IN THE DRAWINGS

Figure 1:
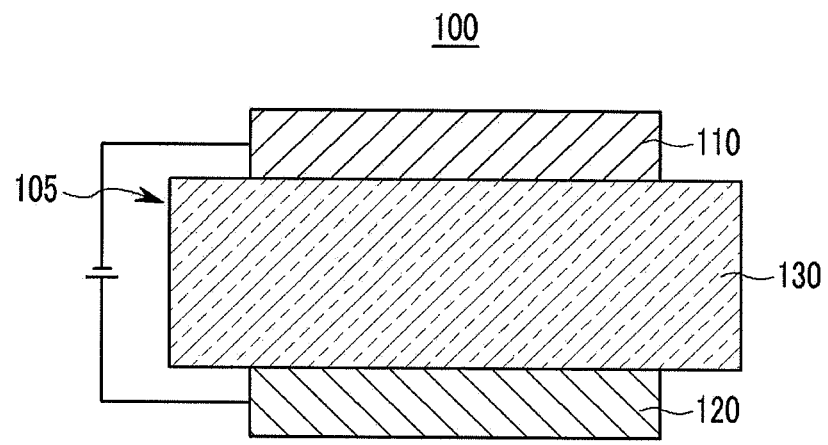
FIGS. 1 to 5 illustrate cross-sectional views showing organic light emitting devices including organic compounds according to various embodiments.

110: organic light emitting device: cathode
120: anode: organic thin layer
130: emission layer: hole transport layer (HTL)
150: electron transport layer (ETL): electron injection layer (EIL)
170: hole injection layer (HIL): emission layer+electron transport layer (ETL)

DETAILED DESCRIPTION

Korean Patent Application No. 10-2008-0137223, filed on Dec. 30, 2008, in the Korean Intellectual Property Office, and entitled: "Compound for Organic Optoelectronic Device, Organic Light Emitting Diode Including the Same and Display Including the Organic Light Emitting Diode," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, when a definition is not otherwise provided, the term "alkyl" may refer to a C1 to C50 alkyl, and preferably a C1 to C15 alkyl; the term "alkoxy" may refer to a C1 to C50 alkoxy, and preferably a C1 to C15 alkoxy; the term "alkenyl" may refer to a C2 to C50 alkenyl, and preferably a C2 to C15 alkenyl; the term "cycloalkyl" may refer to a C3 to C50 cycloalkyl, and preferably a C3 to C15 cycloalkyl; the term "aryl" may refer to a C6 to C50 aryl, and preferably a C6 to C25 aryl; and the term "heterocyclic group" may refer to a C1 to C50 heterocyclic group, and preferably a C1 to C25 heterocyclic group.

In particular, as used herein, when a definition is not otherwise provided, the term "heterocyclic group" may refer to a C3 to C50 heteroaryl group, a C1 to C50 heterocycloalkyl group, a C1 to C50 heterocycloalkenyl group, a C1 to C50 heterocycloalkynyl group, or a fused cyclic group thereof, which includes a heteroatom. The heterocyclic group may include 1 to 20 heteroatoms, and particularly 1 to 15 heteroatoms.

As used herein, when a definition is not otherwise provided, the term "ester" may refer to COOR, and the term "carbonyl" may refer to —COR', where R and R' are each independently hydrogen, a C1 to C10 alkyl group, a C6 to 20 aryl group, a C3 to C20 cycloalkyl group, a C2 to C10 alkenyl group, a C2 to C10 alkynyl group, or a combination thereof.

As used herein, when specific definition is not otherwise provided, the term "substituent" may refer to a halogen, a nitrile group, a cyano group, a nitro group, an amide group, a carbonyl group, an ester group, a C1 to C10 alkyl group, a C1 to C10 alkoxy group, a C2 to C10 alkenyl group, a C2 to C10 alkynyl group, a C3 to C10 cycloalkyl group, or a C6 to C20 aryl group.

As used herein, when specific definition is not otherwise provided, the term "heteroatom" may refer to one selected from N, O, S, P, Se, and Si.

As used herein, when specific definition is not otherwise provided, the prefix "hetero" may refer to one including 1 to 3 heteroatoms, and remaining carbons in one ring.

According to an embodiment, a compound for an organic optoelectronic device represented by the following Chemical Formula 1 is provided. In the compound, an aryl group and a heterocyclic group are sequentially repeated.

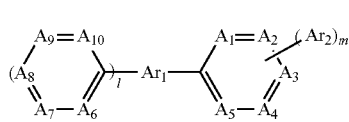

[Chemical Formula 1]

In Chemical Formula 1, $A_1$ to $A_{10}$ may each be independently selected from the group of $CR_1$ to $CR_{10}$, $SiR_1$ to $SiR_{10}$, and N ($A_1$ to $A_{10}$ corresponding to $CR_1$ to $CR_{10}$, respectively, or $SiR_1$ to $SiR_{10}$, respectively, as the case may be). Adjacent ones of $R_1$ to $R_5$ are optionally fused to each other to form a fused ring. Adjacent ones of $R_6$ to $R_{10}$ are optionally fused to each other to form a fused ring. At least one of $A_1$ to $A_5$ may be selected from the group of $SiR_1$ to $SiR_5$ and N, or at least one atom of a fused ring formed by adjacent ones of $R_1$ to $R_5$ may be a heteroatom. At least one of $A_6$ to $A_{10}$ may be selected from the group of $SiR_6$ to $SiR_{10}$ and N, or at least one atom of a fused ring formed by adjacent ones of $R_6$ to $R_{10}$ may be a heteroatom.

In Chemical Formula 1, $R_1$ to $R_{10}$ may each be independently selected from the group of hydrogen, a halogen, a nitrile group, a cyano group, a nitro group, an amide group, a carbonyl group, an ester group, a substituted or unsubstituted alkyl group, a substituted or unsubstituted alkylene group, a substituted or unsubstituted alkoxy group, a substituted or unsubstituted alkenyl group, a substituted or unsubstituted alkenylene group, a substituted or unsubstituted alkynyl group, a substituted or unsubstituted alkynylene group, a substituted or unsubstituted cycloalkyl group, a substituted or unsubstituted cycloalkylene group, a substituted or unsubstituted aryl group, and a substituted or unsubstituted arylene group.

In Chemical Formula 1, $Ar_1$ may be a substituted or unsubstituted arylene group, and $Ar_2$ may be a substituted or unsubstituted aryl group, and said groups may correspond to a C6 to C50 aromatic, e.g., a monocyclic aryl such as phenyl, or a polycyclic aryl such as naphthyl, anthracenyl, phenanthrenyl, pyrenyl, peryenyl, and the like In Chemical Formula 1, l and m are integers ranging from 1 to 4, and, when l and m are 2 or more, each repeating unit may be different.

At least one of $A_1$ to $A_5$ may include N. At least one of $A_6$ to $A_{10}$ may include N. When at least one of $A_1$ to $A_5$ includes N and/or at least one of $A_6$ to $A_{10}$ includes N, a LUMO (lowest unoccupied molecular orbital) energy level may decrease and electron affinity of the compound may increase, resulting in improvement of electron transport properties. Thereby, a driving voltage for an organic optoelectronic device decreases and luminous efficiency of a device may be improved.

When $Ar_1$ is a substituted or unsubstituted arylene group, and/or $Ar_2$ is a substituted or unsubstituted aryl group, the compound may be more useful for an emission layer for a organic optoelectronic device.

When l and m are each independently 2, crystallinity of a thin layer may be lowered and an amorphous structure may be formed to improve thermal stability of an organic optoelectronic device.

The compound for an organic optoelectronic device according to an embodiment may be a compound represented by the following Chemical Formula 2.

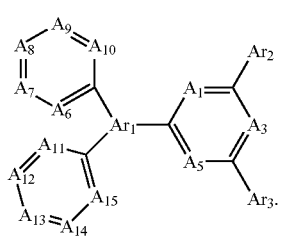

[Chemical Formula 2]

In Chemical Formula 2, $A_1$, $A_3$, $A_5$, and $A_6$ to $A_{15}$ may be independently selected from the group of $CR_1$, $CR_3$, $CR_5$, $CR_6$ to $CR_{15}$, $SiR_1$, $SiR_3$, $SiR_5$, $SiR_6$, to $SiR_{15}$, and N ($A_1$, $A_3$, $A_5$, and $A_6$ to $A_{15}$ corresponding to $CR_1$, $CR_3$, $CR_5$, and $CR_6$ to $CR_{15}$, respectively, or $SiR_1$, $SiR_3$, $SiR_5$, and $SiR_6$, to $SiR_{15}$, respectively, as the case may be). Adjacent ones of $R_6$ to $R_{10}$ are optionally fused to each other to form a fused ring. Adjacent ones of $R_{11}$ to $R_{15}$ are optionally fused to each other to form a fused ring. At least one of $A_1$, $A_3$, and $A_5$ may be selected from the group of $SiR_1$, $SiR_3$, $SiR_5$, and N. At least one of $A_6$ to $A_{10}$ may be selected from the group of $SiR_6$ to $SiR_{10}$ and N, or at least one atom of a fused ring formed by adjacent ones of $R_6$ to $R_{10}$ may be a heteroatom. At least one of $A_{11}$ to $A_{15}$ may be selected from the group of $SiR_{11}$ to $SiR_{15}$ and N, or at least one atom of a fused ring formed by adjacent ones of $R_{11}$ to $R_{15}$ may be a heteroatom.

In Chemical Formula 2, $R_1$, $R_3$, $R_5$, and $R_6$ to $R_{15}$ may each independently be selected from the group of hydrogen, a halogen, a nitrile group, a cyano group, a nitro group, an amide group, a carbonyl group, an ester group, a substituted or unsubstituted alkyl group, a substituted or unsubstituted alkylene group, a substituted or unsubstituted alkoxy group, a substituted or unsubstituted alkenyl group, a substituted or unsubstituted alkenylene group, a substituted or unsubstituted alkynyl group, a substituted or unsubstituted alkynylene group, a substituted or unsubstituted cycloalkyl group, a substituted or unsubstituted cycloalkylene group, a substituted or unsubstituted aryl group, and a substituted or unsubstituted arylene group.

In Chemical Formula 2, $Ar_1$ may be a substituted or unsubstituted arylene group.

In Chemical Formula 2, $Ar_2$ and $Ar_3$ may be independently a substituted or unsubstituted aryl group, and the aryl may be a C6 to C50 aromatic, e.g., a monocyclic aryl such as phenyl, or a polycyclic aryl such as naphthyl, anthracenyl, phenanthrenyl, pyrenyl, peryenyl, and the like.

Preferably, at least one of $A_1$, $A_3$ and $A_5$ includes N, at least one of $A_6$ to $A_{10}$ includes N, and at least one of $A_{11}$ to $A_{15}$ includes N.

When $Ar_1$ is a substituted or unsubstituted arylene group and/or $Ar_2$ and $Ar_3$ are independently a substituted or unsubstituted aryl group, the compound may be more useful for an emission layer for a organic optoelectronic device.

When $R_1$ to $R_{10}$ of Chemical Formula 1 and $R_1$, $R_3$, $R_5$, $R_6$ to $R_{15}$ of Chemical Formula 2 is a substituted or unsubstituted aryl group, or a substituted or unsubstituted arylene group, the aryl may be C6 to C50 aryl. Particularly, when the aryl is a monocyclic aryl such as phenyl, biphenyl, terphenyl, styrenyl, and the like, or a polycyclic aryl naphthyl, anthracenyl, phenanthrenyl, pyrenyl, peryenyl, pyrenyl, and the like, the compound may be more useful for an emission layer for a organic optoelectronic device.

In Chemical Formula 1, adjacent ones of $R_1$ to $R_5$ may be fused to each other to form a fused ring, and adjacent ones of $R_6$ to $R_{10}$ may be fused to each other to form a fused ring. In Chemical Formula 2, adjacent ones of $R_6$ to $R_{10}$ may be fused to each other to form a fused ring, and adjacent ones of $R_{11}$ to $R_{15}$ may be fused to each other to form a fused ring. A fused ring including $A_1$ to $A_5$ and a fused ring including $A_6$ to $A_{10}$, in Chemical Formula 1, and a fused ring including $A_6$ to $A_{10}$ and a fused ring including $A_{11}$ to $A_{15}$ in Chemical Formula 2 may be a substituted or unsubstituted heterocyclic group.

The heterocyclic group may be selected from the group of a thiophenyl group, a furanyl group, a pyrrolyl group, an imidazolyl group, a thiazolyl group, an oxazolyl group, an oxadiazolyl group, a triazolyl group, a carbazolyl group, a pyridinyl group, a pyridazine group, a quinolinyl group, an isoquinolinyl group, an arcidyl group, an imidazopyridinyl group, and an imidazopyrimidinyl group.

In an embodiment, a substituent linked to nitrogen (N) of the imidazolyl or triazolyl group may be selected from the group of an alkyl group such as a substituted or unsubstituted methyl group, ethyl group, propyl group, isopropyl group, butyl group, tertiary-butyl group, pentyl group, hexyl group, heptyl group, and the like; a cycloalkyl group such as a substituted or unsubstituted cyclopentyl group, cyclohexyl group, and the like; an aryl group such as a substituted or unsubstituted phenyl group, biphenyl group, naphthyl group, and the like; and a substituted or unsubstituted heterocyclic group. The heterocyclic group is preferably a heteroaryl group such as pyridyl, bipyridyl, quinolyl, isoquinolyl, and the like.

The various substituents of the above-described compounds represented by the above Chemical Formula 1 and Chemical Formula 2 may be configured to preserve principal properties of the compound for an organic optoelectronic device according to an embodiment.

Examples of the compounds for an organic optoelectronic device according to an embodiment include compounds represented by the following Formulae 3 to 52:

[Chemical Formula 3]

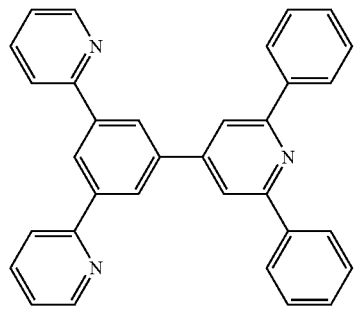

[Chemical Formula 4]

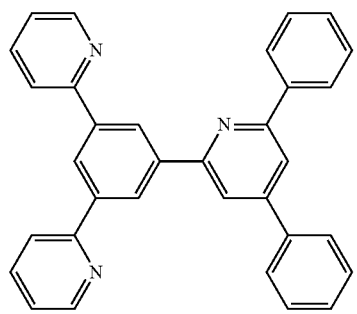

[Chemical Formula 5]

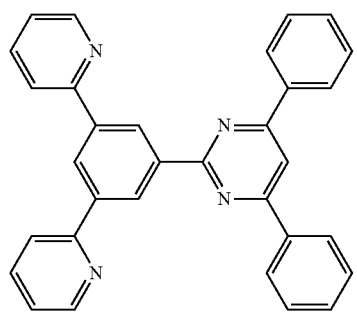

[Chemical Formula 6]

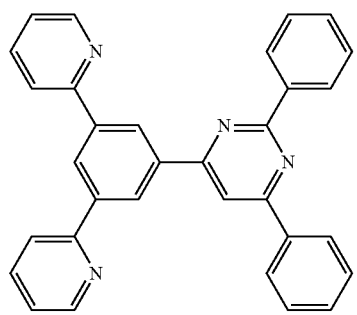

[Chemical Formula 7]

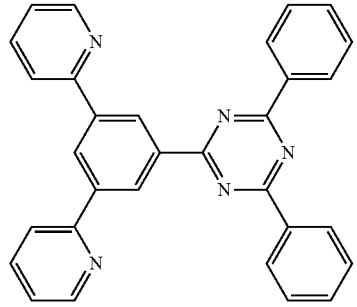

[Chemical Formula 8]
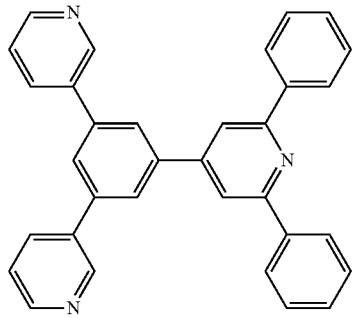
[Chemical Formula 9]
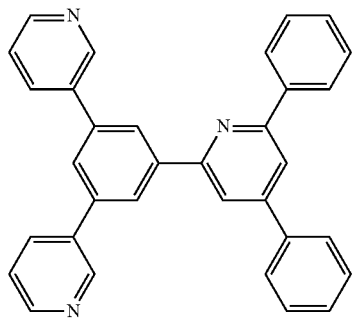
[Chemical Formula 10]
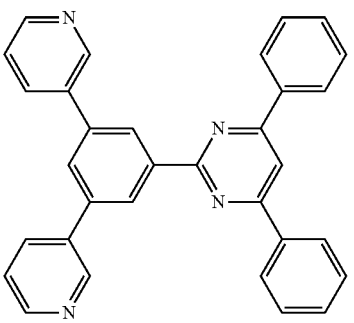
[Chemical Formula 11]
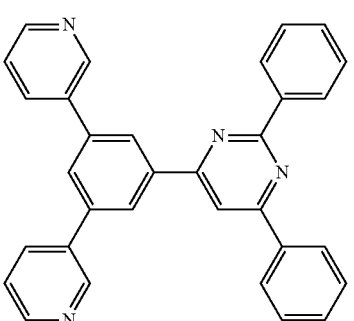
[Chemical Formula 12]
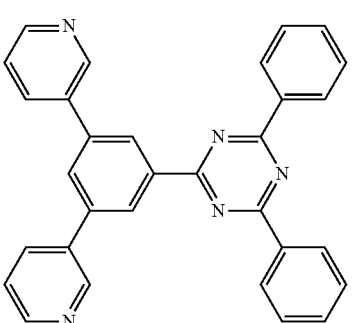
[Chemical Formula 13]
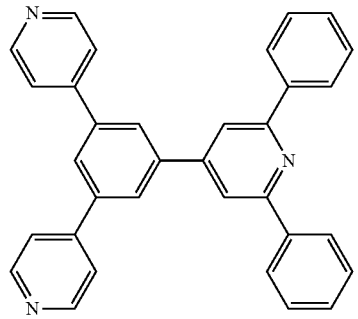
[Chemical Formula 14]
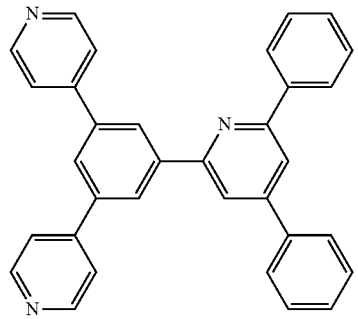
[Chemical Formula 15]
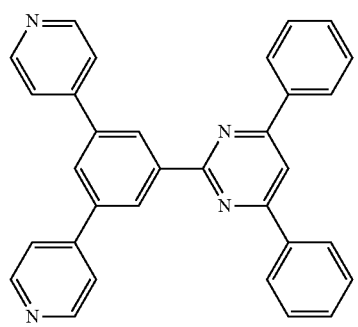
[Chemical Formula 16]
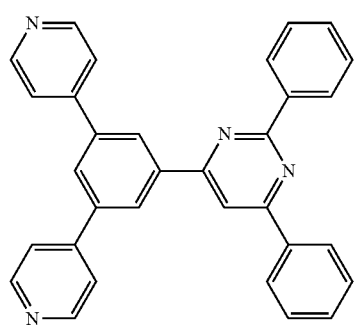
[Chemical Formula 17]
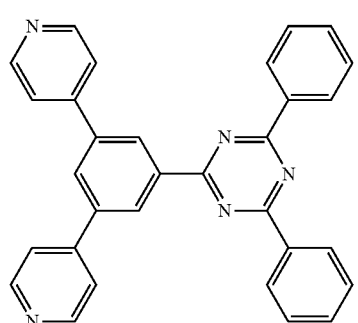

[Chemical Formula 18]
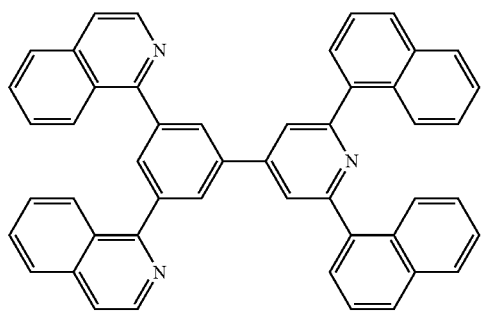
[Chemical Formula 22]
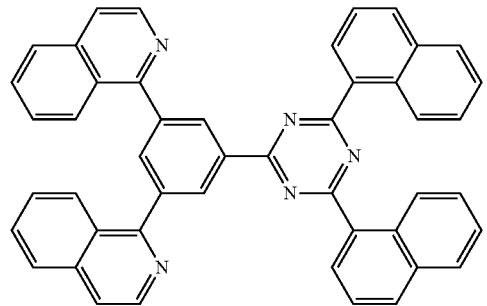
[Chemical Formula 19]
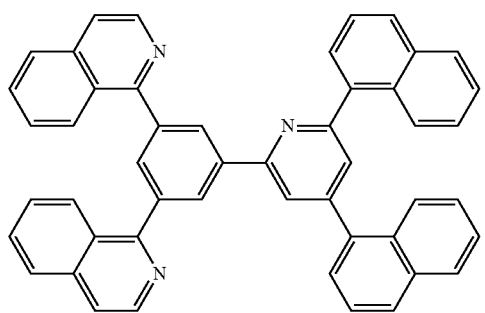
[Chemical Formula 23]
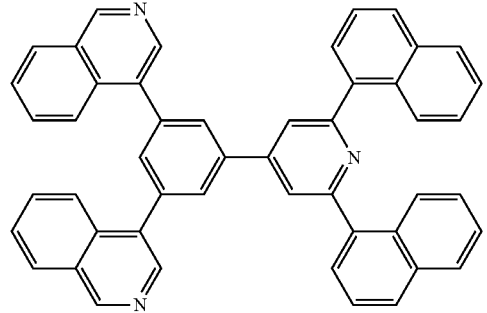
[Chemical Formula 20]
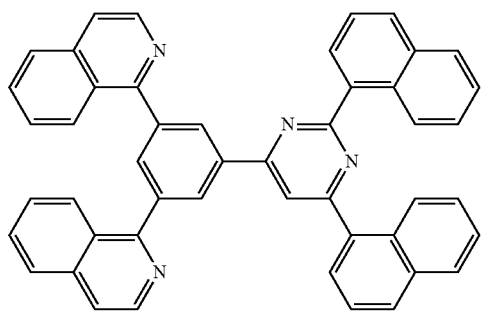
[Chemical Formula 24]
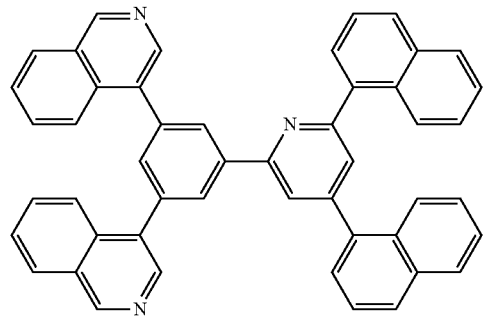
[Chemical Formula 21]
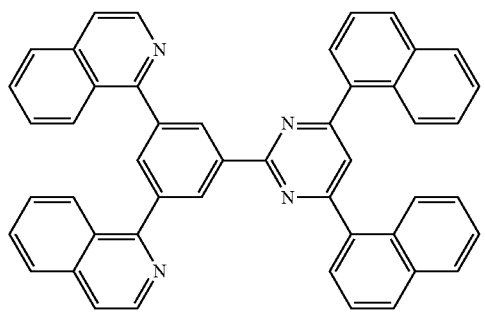
[Chemical Formula 25]
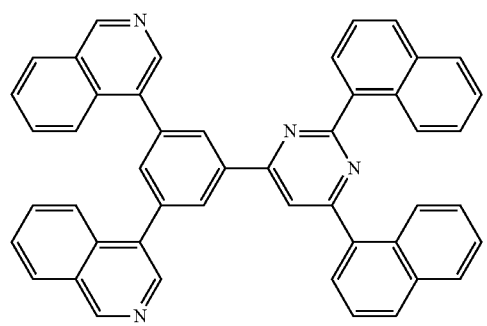

[Chemical Formula 26]
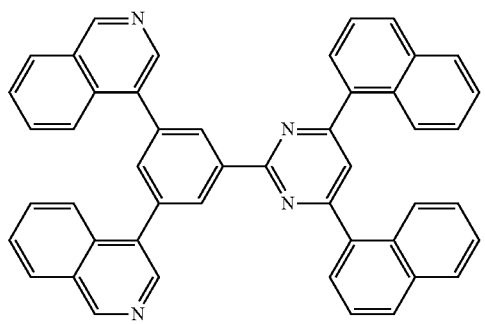
[Chemical Formula 27]
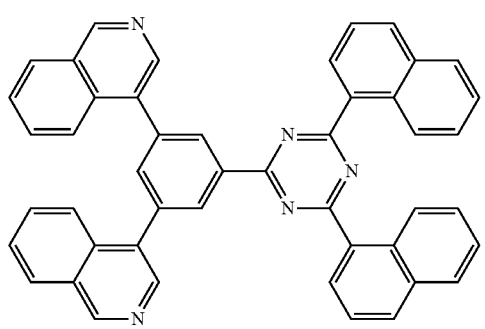
[Chemical Formula 28]
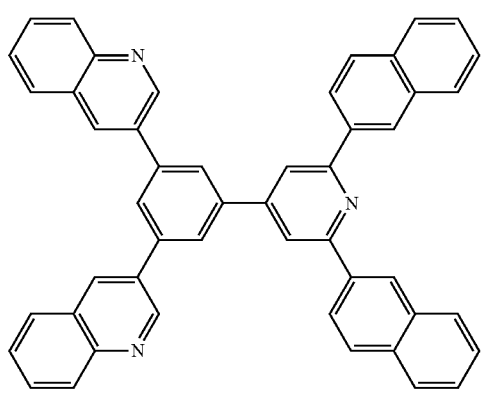
[Chemical Formula 29]
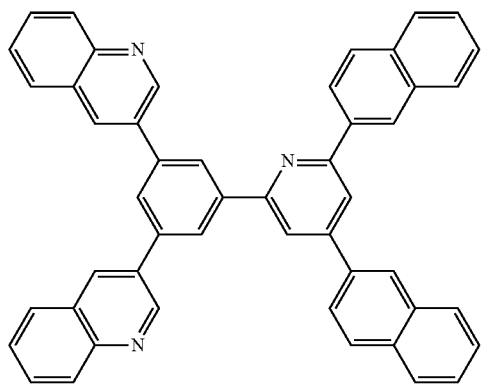
[Chemical Formula 30]
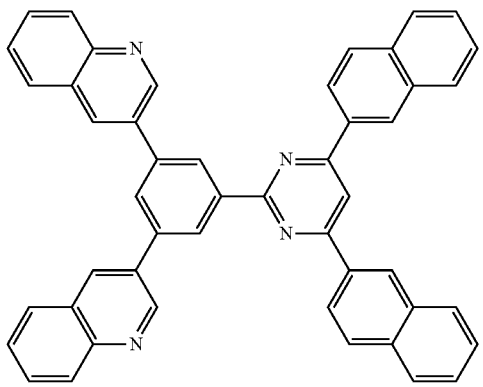
[Chemical Formula 31]
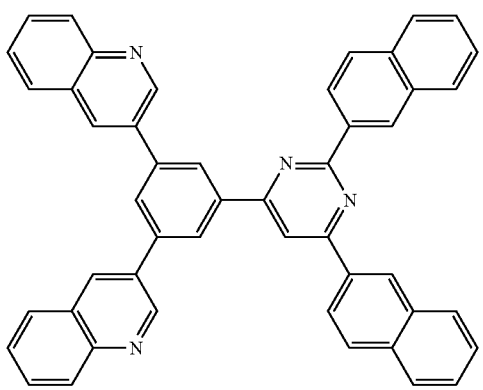
[Chemical Formula 32]
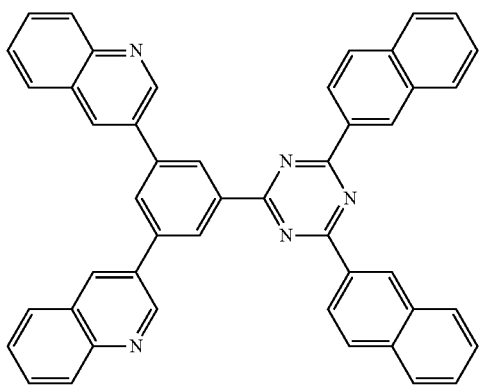
[Chemical Formula 33]
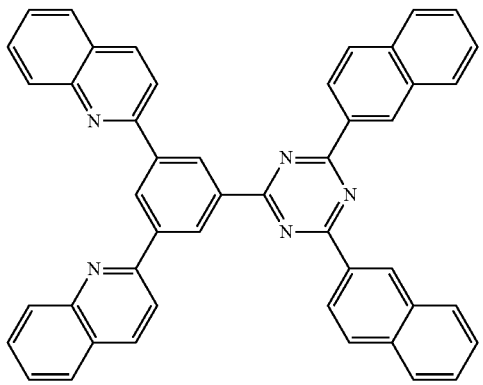

[Chemical Formula 34]
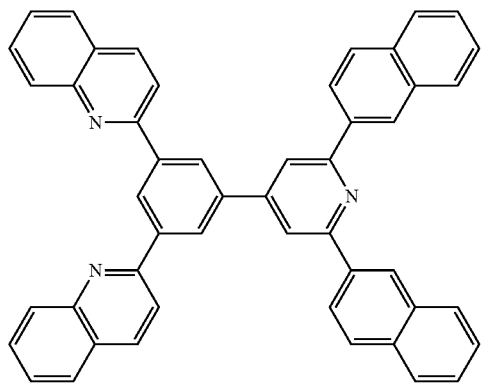
[Chemical Formula 35]
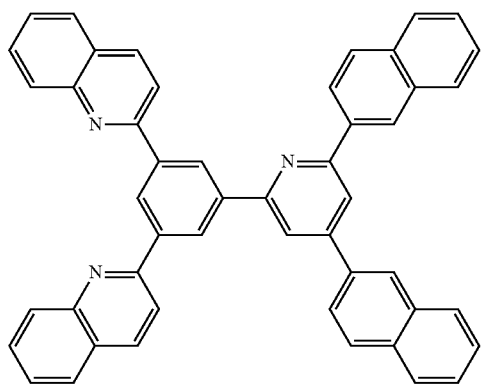
[Chemical Formula 36]
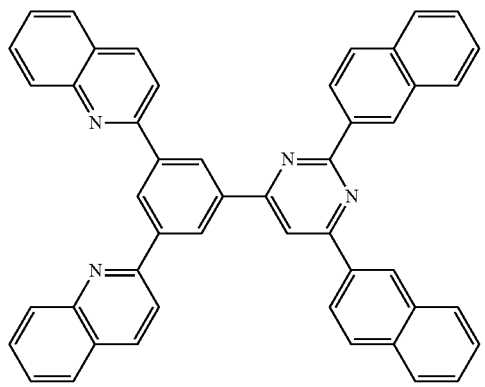
[Chemical Formula 37]
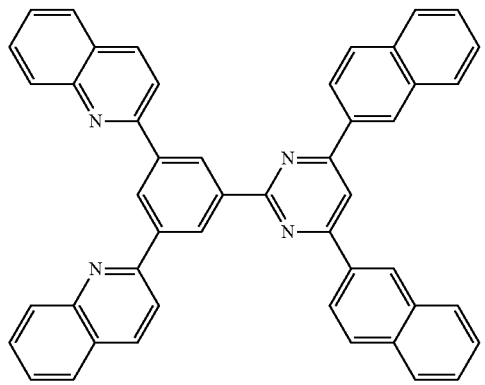
[Chemical Formula 38]
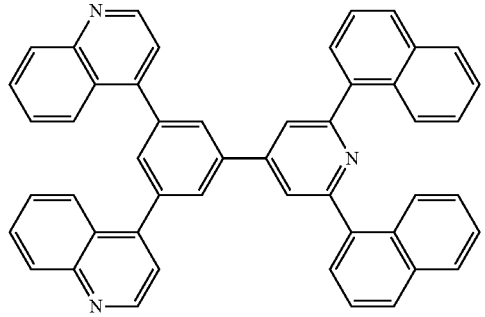
[Chemical Formula 39]
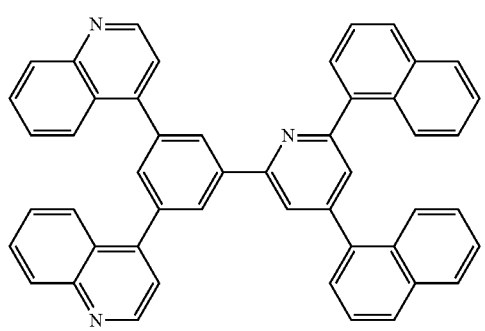
[Chemical Formula 40]
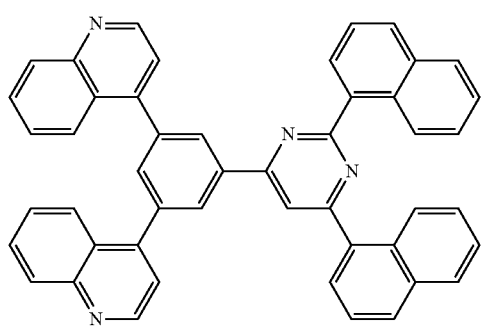
[Chemical Formula 41]
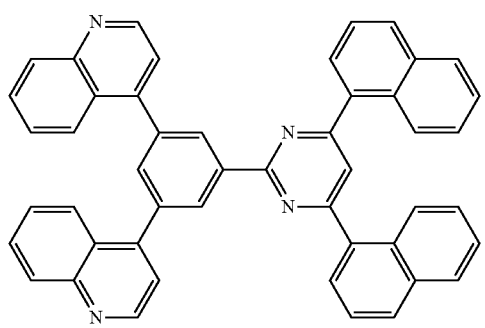

[Chemical Formula 42]
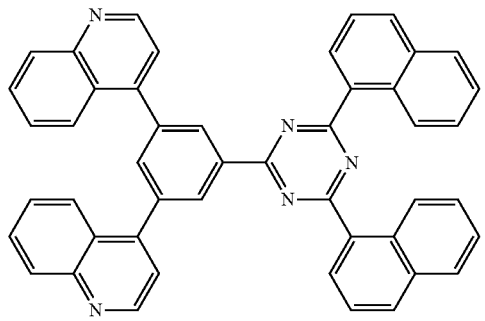
[Chemical Formula 43]
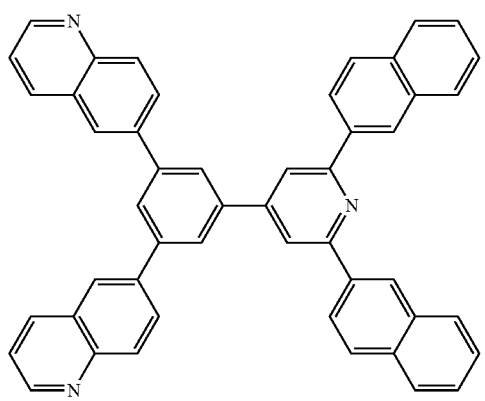
[Chemical Formula 44]
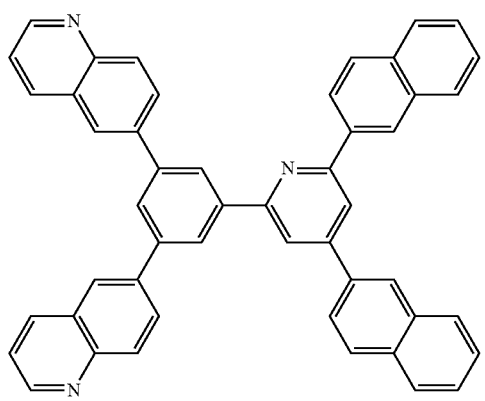
[Chemical Formula 45]
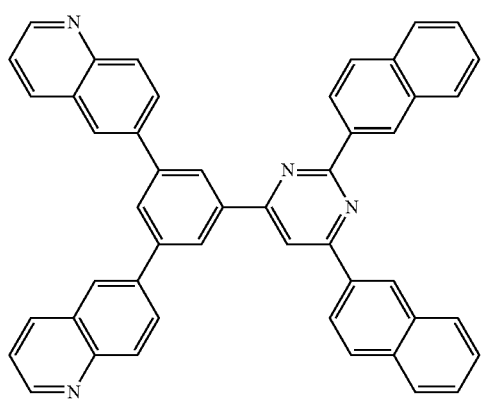
[Chemical Formula 46]
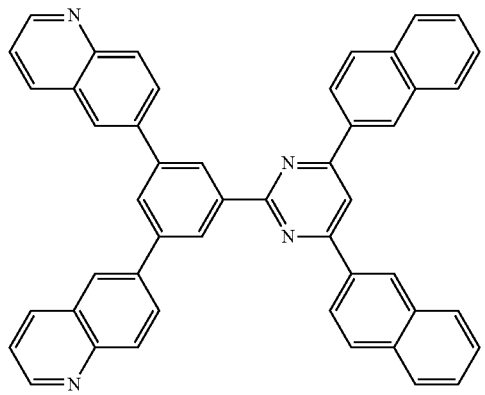
[Chemical Formula 47]
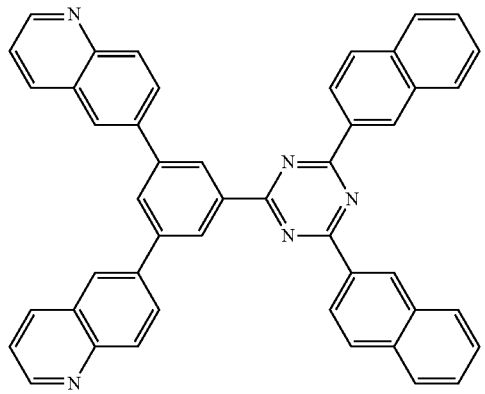
[Chemical Formula 48]
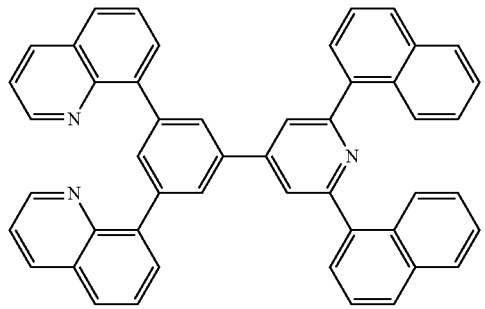
[Chemical Formula 49]
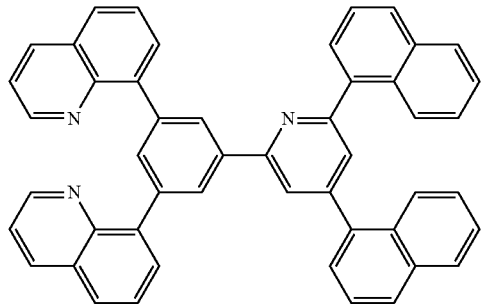

-continued

[Chemical Formula 50]

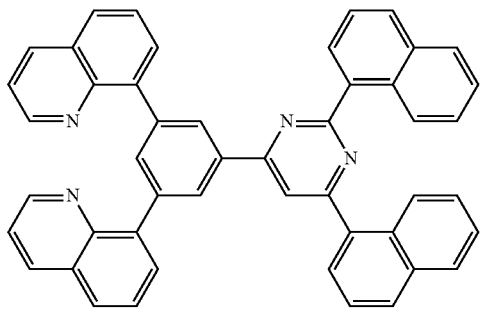

[Chemical Formula 51]

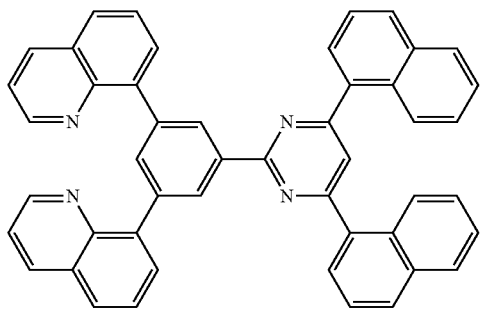

[Chemical Formula 52]

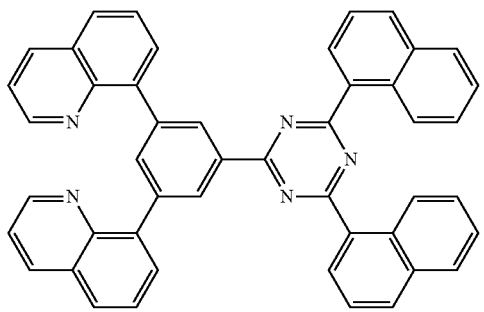

The compound for an organic optoelectronic device including the above compounds may be used as a light emitting host with an appropriate dopant due to good hole and electron transport capability.

The dopant may be a reducing dopant. The reducing dopant may be selected from the group of an alkali metal, an alkali earth metal, a rare earth element metal, an oxide of an alkali metal, a halide of an alkali metal, an organic complex of an alkali metal, an oxide of an alkali earth metal, a halide of an alkali earth metal, an organic complex of an alkali earth metal, an oxide of an alkali earth metal, a halide of an alkali earth metal, an organic complex of an alkali earth metal, an oxide of a rare earth element metal, a halide of a rare earth element metal, and an organic complex of a rare earth element metal.

The compound for an organic optoelectronic device may be used in an organic thin layer of an organic optoelectronic device, and thus provide an organic optoelectronic device having improved efficiency and a low driving voltage. Also, life-span of the organic optoelectronic device may be improved.

Another embodiment provides an organic optoelectronic device including the compound for an organic optoelectronic device. Such an organic optoelectronic device includes an organic photoelectronic device, an organic light emitting diode (OLED), an organic solar cell, an organic photo conductor drum, an organic transistor, an organic memory device, or the like. The compound for an organic optoelectronic device according to an embodiment may be applied to an electrode or an electrode buffer layer of an organic solar cell to improve quantum efficiency, or may be applied to an electrode material of a gate, source-drain electrodes, and the like of an organic transistor.

Hereinafter, an organic light emitting diode is described in more detail.

According to an embodiment, an organic light emitting diode includes an anode and a cathode, and at least one organic thin layer disposed between the anode and cathode. The organic thin layer may include the compound for an organic optoelectronic device according to an embodiment.

The compound for an organic optoelectronic device may be included in an organic thin layer that includes at least one of an emission layer, a hole transport layer (HTL), a hole injection layer (HIL), a hole blocking layer, an electron transport layer (ETL), an electron injection layer (EIL), an electron blocking layer, or a combination thereof. At least one of these organic thin layers may include the compound for an organic optoelectronic device. In an embodiment, at least one of an emission layer, a hole transport layer (HTL), a hole injection layer (HIL), an electron transport layer (ETL), an electron injection layer (EIL), or a combination thereof may include the compound for an organic optoelectronic device according to an embodiment.

FIGS. 1 to 5 illustrate cross-sectional views showing organic light emitting diodes including organic compounds according to various embodiments.

Referring to FIGS. 1 to 5, the organic light emitting diodes 100, 200, 300, 400, and 500 according to an embodiment include at least one organic thin layer 105 interposed between an anode 120 and a cathode 110.

The anode 120 may include an anode material having a large work function to help hole injection into an organic thin layer. The anode material may include a metal such as nickel, platinum, vanadium, chromium, copper, zinc, and gold, or alloys thereof; a metal oxide such as zinc oxide, indium oxide, indium tin oxide (ITO), and indium zinc oxide (IZO); a combined metal and oxide such as ZnO:Al or SnO$_2$:Sb; or a conductive polymer such as poly(3-methylthiophene), poly [3,4-(ethylene-1,2-dioxy)thiophene] (PEDT), polypyrrole, and polyaniline, etc.

The cathode 110 may include a cathode material having a small work function to help electron injection into an organic thin layer. The cathode material may include a metal such as magnesium, calcium, sodium, potassium, titanium, indium, yttrium, lithium, gadolinium, aluminum, silver, tin, and lead, or alloys thereof; or a multi-layered material such as LiF/Al, Liq/Al, LiO$_2$/Al, LiF/Ca, LiF/Al, and BaF$_2$/Ca, etc.

In the example embodiment shown in FIG. 1, the organic light emitting diode 100 includes an organic thin layer 105 including only an emission layer 130.

Figure 2:
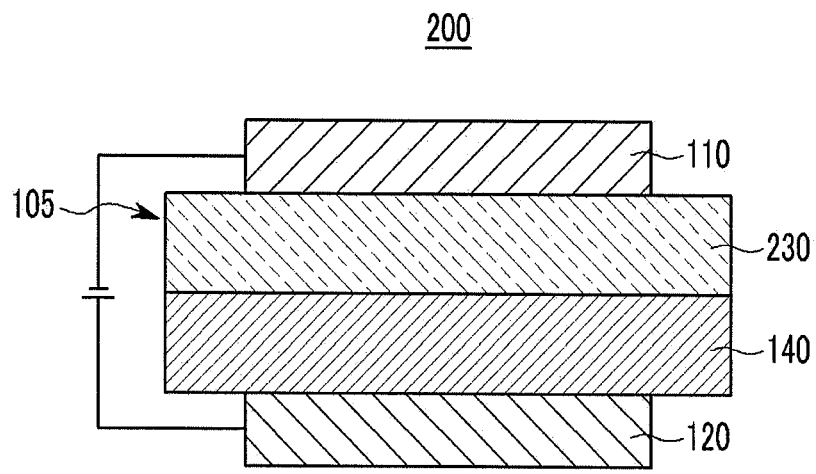

In the example embodiment shown in FIG. 2, a double-layered organic light emitting diode 200 includes an organic thin layer 105 including an emission layer 230 including an electron transport layer (ETL), and a hole transport layer (HTL) 140. The emission layer 230 also functions as an electron transport layer (ETL), and the hole transport layer (HTL) 140 layer has an excellent binding property with a transparent electrode such as ITO or an excellent hole transporting property.

Figure 3:
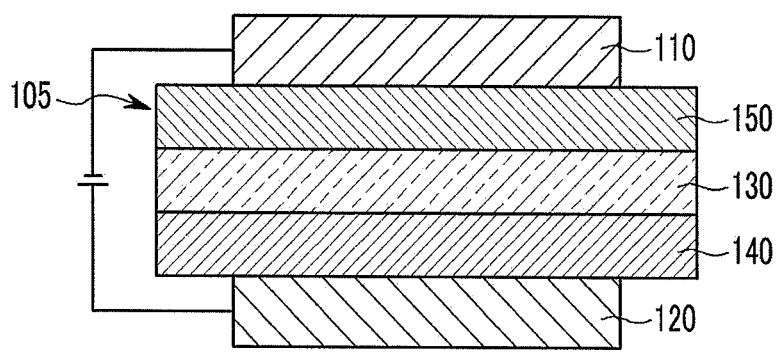

In the example embodiment shown in FIG. 3, a three-layered organic light emitting diode 300 includes an organic thin layer 105 including an electron transport layer (ETL)

150, an emission layer 130, and a hole transport layer (HTL) 140. The emission layer 130 is independently installed, and layers having an excellent electron transporting property or an excellent hole transporting property are separately stacked.

Figure 4:
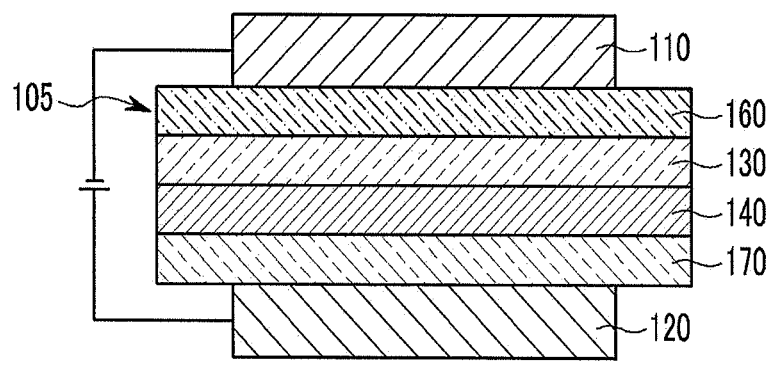

In the example embodiment shown in FIG. 4, a four-layered organic light emitting diode 400 includes an organic thin layer 105 including an electron injection layer (EIL) 160, an emission layer 130, a hole transport layer (HTL) 140, and a hole injection layer (HIL) 170 for binding with the anode 120 of ITO.

Figure 5:
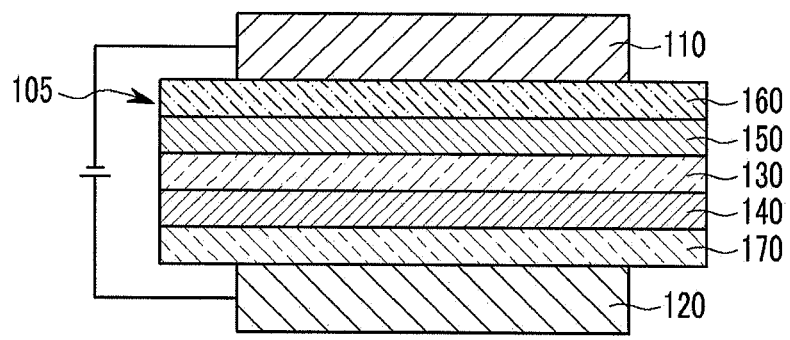

In the example embodiment shown in FIG. 5, a five layered organic light emitting diode 500 includes an organic thin layer 105 including an electron transport layer (ETL) 150, an emission layer 130, a hole transport layer (HTL) 140, and a hole injection layer (HIL) 170, and further includes an electron injection layer (EIL) 160 to achieve a low voltage.

The organic light emitting diode may be fabricated by forming an anode on a substrate, forming an organic thin layer, and forming a cathode thereon. The organic thin layer may be formed by a dry coating method such as evaporation, sputtering, plasma plating, and ion plating, or a wet coating method such as spin coating, dipping, and flow coating.

Another embodiment provides a display including the organic light emitting diode according to the above embodiment.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Synthesis of Compound for an Organic Optoelectronic Device

EXAMPLE 1

Synthesis of Compound of Chemical Formula 28

A compound represented by the above Chemical Formula 28, as a specific example of a compound for an organic optoelectronic device according to an embodiment, was synthesized through four steps as provided in the following Reaction Schemes 1-4.

Synthesis of an Intermediate Product (A); First Step 20 g (63.5 mmol) of tribromobenzene, 24.2 g (139.8 mmol) of quinoline-3-boronic acid, 7.4 g (6.4 mmol) of tetrakis(triphenylphosphine)palladium 0, and 52.7 g (381.2 mmol) of potassium carbonate were dissolved in 800 ml of a solvent (prepared by mixing tetrahydrofuran/$H_2O$ in a volume ratio of 3/1) and then reacted at 85° C. for 18 hours. The obtained reactant was extracted with ethyl acetate, and then the solvent was removed under a reduced pressure. The extracted product was separated using a column and dried, obtaining 13 g (Y=50%) of a solid.

Synthesis of Intermediate Product (B); Second Step 10 g (36.5 mmol) of 2-6-dibromo-4-iodopyridine was dissolved in 500 ml of tetrahydrofuran. Then, the solution was maintained at 78° C. Then, 22.8 ml (36.51 mmol) of a 1.6 M n-butyl lithium solution was slowly dropped to the above solution. The mixture was agitated at 78° C. for one hour. Next, 10.1 ml (43.8 mmol) of triisopropyl borate was added to the agitated mixture. The resulting mixture was slowly heated to room temperature and reacted for 18 hours while agitated. To the reaction mixture, an aqueous sodium hydroxide solution was added. The mixture was agitated for one hour, and then hydrochloric acid was used to adjust acidity of the entire solution to neutral. Then, the reactant was extracted using ethyl acetate, and the solvent was removed under a reduced pressure, separated using a column, and dried, obtaining a solid of 2.83 g (Y=40%).

Synthesis of Intermediate Product (C); Third Step 4.81 g (11.7 mmol) of the intermediate product (A) obtained in the first step, 2.21 g (11.52 mmol) of the intermediate product (B) obtained in the second step, 1.26 g (1.1 mmol) of tetrakis(triphenyl-phosphine)palladium 0, and 4.52 g (32.7 mmol) of potassium carbonate were dissolved in 180 ml of a solvent prepared by mixing tetrahydrofuran/$H_2O$ in a volume ratio of 3/1. The solution was reacted at 75° C. for 18 hours. The obtained reactant was extracted using ethyl acetate, separated using a column after removing the solvent under a reduced pressure, and dried, obtaining a solid of 3.74 g (Y=68%).

Synthesis of Compound of Chemical Formula 28; Fourth Step 3.74 g (7.82 mmol) of intermediate product (C) obtained in the step 3, 2.96 g (17.2 mmol) of naphthalene-2-boronic acid, 0.9 g (0.78 mmol) of tetrakis(triphenylphosphine)palladium 0, and 6.48 g (46.9 mmol) of potassium carbonate were dissolved in 160 ml of a solvent prepared by mixing tetrahydrofuran/$H_2O$ in a volume ratio of 3/1. The solution was reacted at 85° C. for 3 hours. The resulting reactant was extracted using chloroform, separated using a column after removing the solvent under a reduced pressure, and dried, obtaining a solid of 2 g (Y=39%).

EXAMPLE 2

Synthesis of Compound of Chemical Formula 30

A compound represented by the above Chemical Formula 30, as a specific example of a compound for an organic optoelectronic device according to an embodiment, was synthesized through three steps in the following Reaction Schemes 5-7.

Synthesis of Intermediate Product (D); First Step 20 g (109.04 mmol) of 2,4,6-trichloropyrimidine, 37.5 g (218.04 mmol) of naphthalene-2-boronic acid, 6.3 g (5.45 mmol) of tetrakis(triphenylphosphine)palladium 0, and 60.3 g (436.29 mmol) of potassium carbonate were dissolved in 600 ml of a solvent prepared by mixing tetrahydrofuran/$H_2O$ in a volume ratio of 2/1. The solution was reacted at 80° C. for 6 hours. The resulting reactant was extracted using chloroform, separated using a column after removing the solvent under a reduced pressure, and dried, obtaining a solid of 29.5 g (Y=74%).

Synthesis of an Intermediate Product (E); Second Step 21.11 g (51.33 mmol) of the intermediate product (A), 15.64 g (61.59 mmol) of bis(pinacolato)diborone, 2.1 g (2.57 mmol) of [1,1'-bis(diphenylphosphino)ferrocene]dichloro palladium (II) complex with dichloromethane, and 15.1 g (153.98 mmol) of potassium acetate were dissolved in 500 ml of toluene. The solution was heated at 80° C. for 18 hours. The resulting reactant was extracted using chloroform, separated using a column after removing the solvent under a reduced pressure, and dried, obtaining a solid of 21.9 g (Y=96%).

Synthesis of Compound of Chemical Formula 30; Third Step 3 g (8.18 mmol) of the intermediate product (D) prepared in the first step, 3.29 g (7.44 mmol) of the intermediate product (E) prepared in the second step, 0.43 g (0.37 mmol) of tetrakis(triphenylphosphine)palladium 0, and 3.08 g (22.3 mmol) of potassium carbonate were dissolved in 120 ml of a solvent prepared by mixing tetrahydrofuran/$H_2O$ in a volume ratio of 3/1. The solution was reacted at 85° C. for 18 hours. The resulting reactant was extracted using chloroform, separated using a column after removing the solvent under a reduced pressure, and then dried, obtaining a solid of 3.5 g (Y=70%).

EXAMPLE 3

Synthesis of Compound of Chemical Formula 31

A compound represented by the above Chemical Formula 31, as a specific example of a compound for an organic optoelectronic device according to an embodiment, was synthesized through two steps provided in the following Reaction Schemes 8-9.

Synthesis of an Intermediate Product (F); First Step 6 g (13.09 mmol) of the intermediate product (F), 2.4 g (13.09 mmol) of 2,4,6-trichloropyrimidine, 0.38 g (0.33 mmol) of tetrakis(triphenylphosphine)palladium 0, and 3.62 g (26.19 mmol) of potassium carbonate were dissolved in 72 ml of a solvent prepared by mixing tetrahydrofuran/$H_2O$ in a volume ratio of 2/1. The solution was reacted at 80° C. for 6 hours. The resulting reactant was extracted using chloroform, separated using a column after removing the solvent under a reduced pressure, and then dried, obtaining a solid of 4.9 g (Y=78%).

Synthesis of Compound of Chemical Formula 31; Second Step 4.9 g (10.22 mmol) of the intermediate product (F) prepared in the first step, 3.9 g (22.68 mmol) of naphthalene-2-boronic acid, 0.6 g (0.52 mmol) of tetrakis(triphenylphosphine)palladium 0, and 5.7 g (41.24 mmol) of potassium carbonate were dissolved in 350 ml of a solvent prepared by mixing tetrahydrofuran/$H_2O$/toluene in a volume ratio of 3/2/2. The solution was reacted at 110° C. for 24 hours. The resulting reactant was extracted using chloroform, separated using a column after removing the solvent under a reduced pressure, and then dried, obtaining a solid of 3.9 g (Y=58%).

Figure 6:
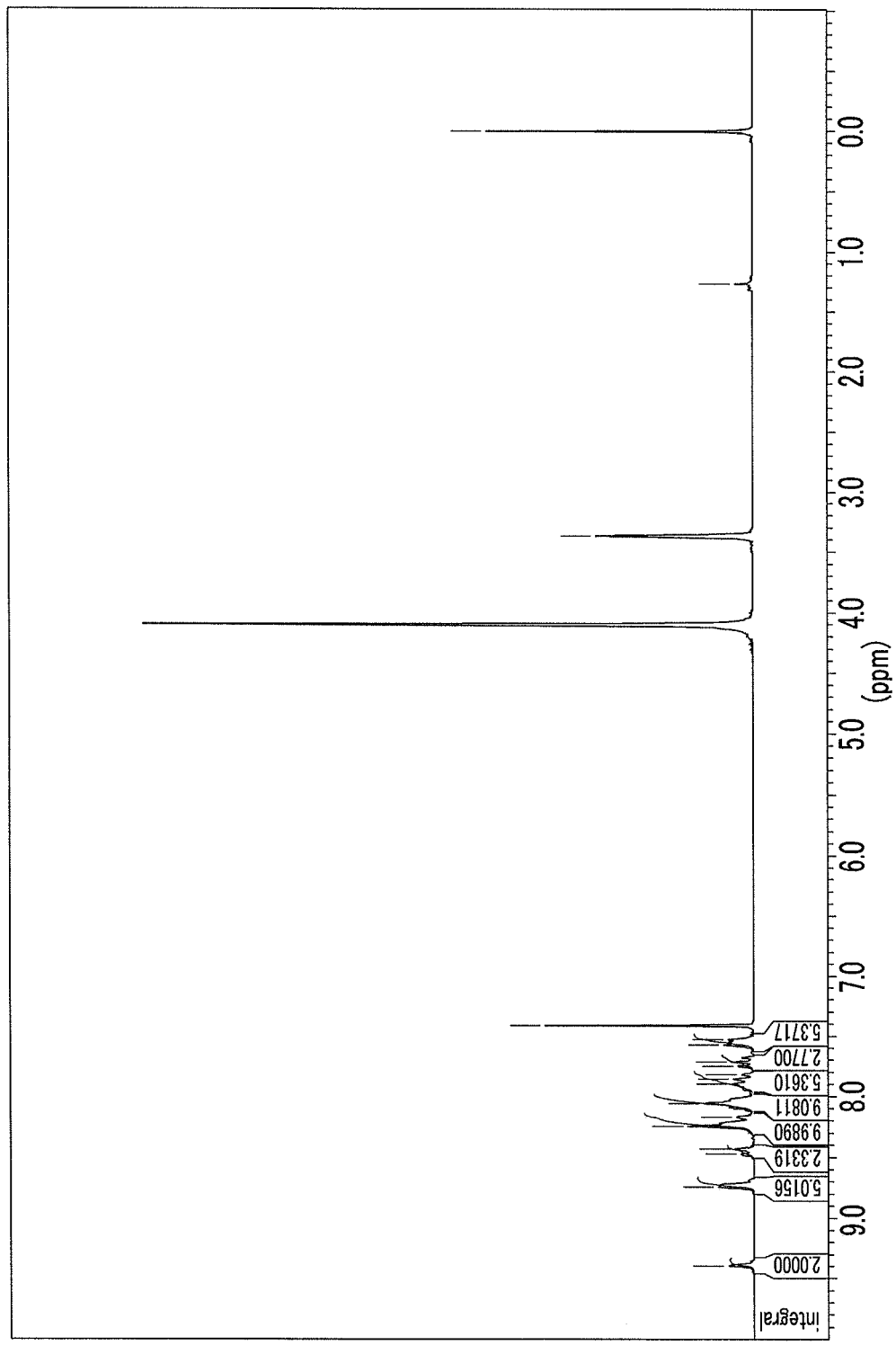
FIG. 6 illustrates a $^1$H NMR spectrum of the compound according to Example 1.
Figure 7:
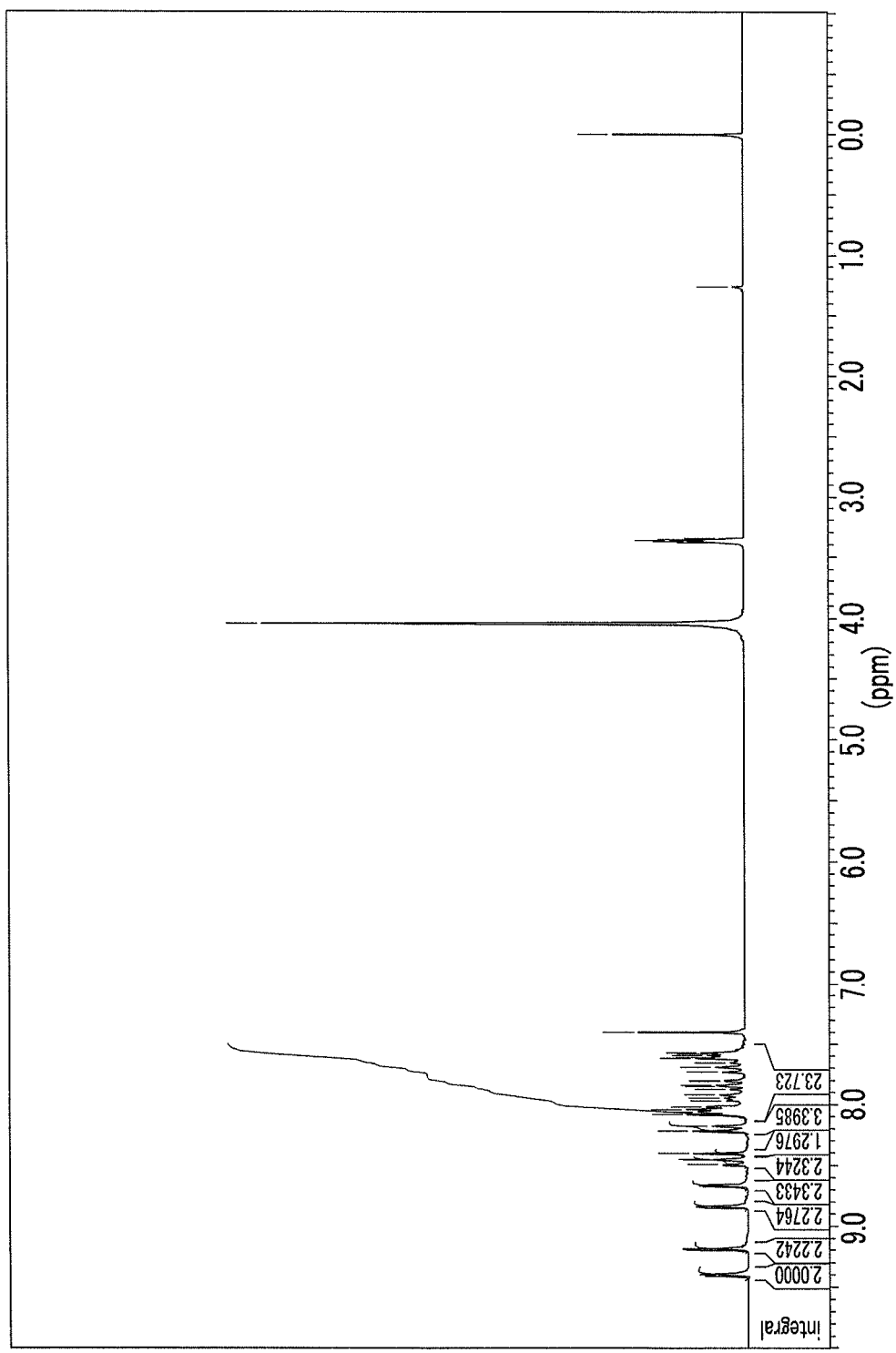
FIG. 7 illustrates a $^1$H NMR spectrum of the compound according to Example 2.
Figure 8:
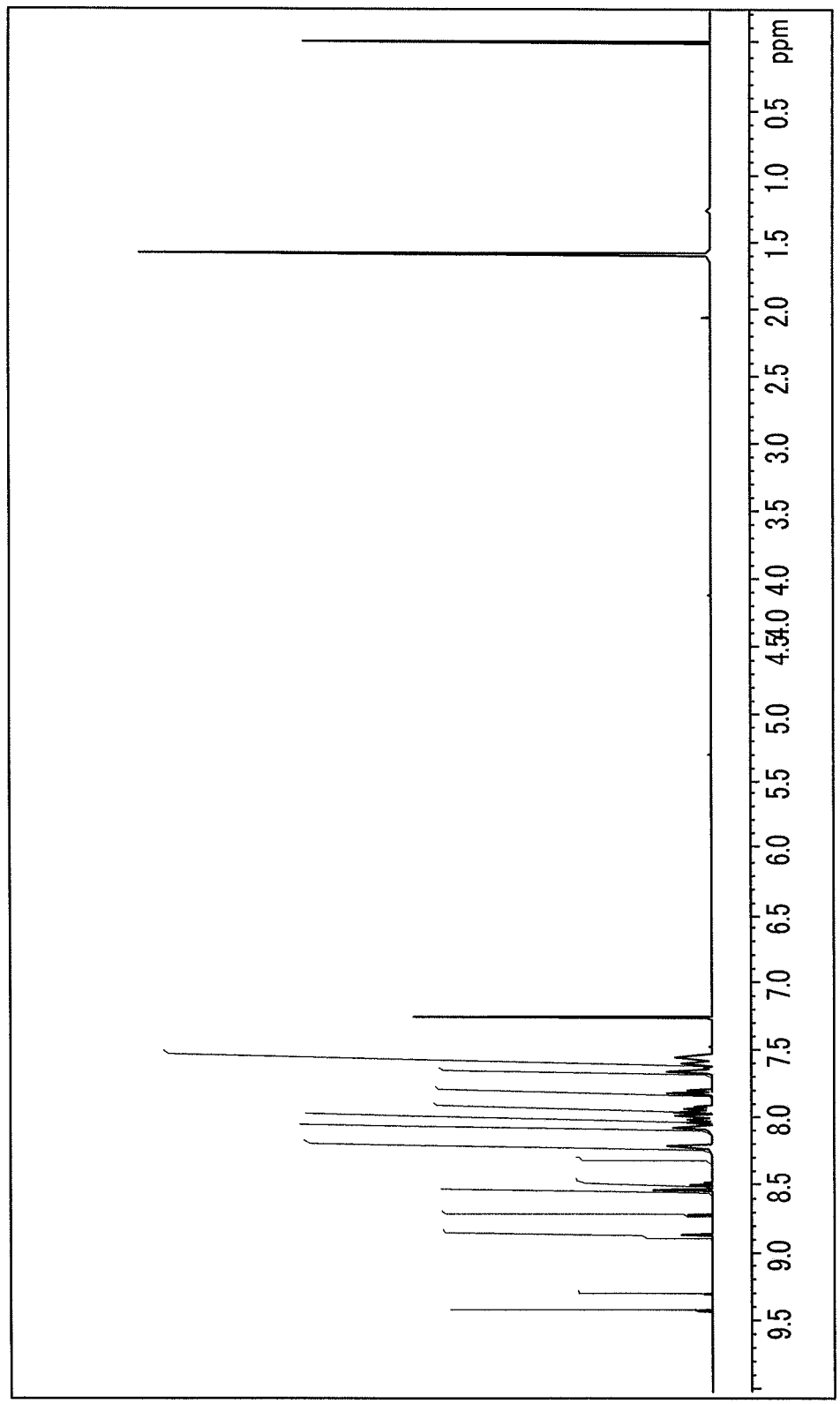
FIG. 8 illustrates a $^1$H NMR spectrum of the compound according to Example 3.

The compounds synthesized according to Examples 1 to 3 were analyzed using $^1H$ NMR (nuclear magnetic resonance spectroscopy). The results are respectively provided in FIGS. 6 to 8.

Fabrication of Organic Light Emitting Diode

EXAMPLE 4

A positive electrode was fabricated by cutting a 15 $\Omega/cm^2$ 1200 Å ITO glass substrate (Corning Inc.) to have a size of 50 mm×50 mm, and cleaning it with an ultrasound in isopropyl alcohol and pure water respectively for 5 minutes, and then with UV-ozone for 30 minutes.

Then, thermal vacuum-deposition was performed on the glass substrate under a degree of vacuum 650 $10^{-7}$ Pa. First of all, an N1,N1'-(biphenyl-4,4'-diyl)bis (N1-(naphthalene-2-yl)-N4,N4-diphenylbenzene-1,4-diamine (65 nm) hole injection layer (HIL) was deposited, and then an N,N'-di(1-naphthyl)-N,N'-diphenylbenzidine (NPB) (40 nm) hole transport layer (HTL) was deposited thereon.

Then, an emission layer (25 nm), which was prepared by mixing 5 wt % of N,N,N',N'-tetrakis(3,4-dimethylphenyl) chrysene-6,12-diamine and 95 wt % of 9-(3-(naphthalene-1-yl)phenyl)-10-(naphthalene-2-yl)anthracene, was deposited thereon, and an electron transport layer (ETL) prepared by using the compound (35 nm) according to Example 1 was deposited.

On the electron transport layer (ETL), Liq as an electron injection layer (EIL) was vacuum-deposited to be 0.5 nm thick under the same deposit condition, and Al was vacuum-deposited to be 100 nm thick to form a Liq/Al electrode. The organic light emitting diode had a structure as shown in FIG. 5.

EXAMPLE 5

An organic light emitting diode was fabricated according to the same method as in Example 4, except for using the compound according to Example 2 for an electron transport layer (ETL).

EXAMPLE 6

An organic light emitting diode was fabricated according to the same method as in Example 4, except for using the compound according to Example 3 for an electron transport layer (ETL).

COMPARATIVE EXAMPLE 1

An organic light emitting diode was fabricated according to the same method as in Example 4, except for using $Alq_3$ as an electron transport material to form an electron transport layer (ETL).

Property Measurement and Analysis

1) Measurement of driving voltage, luminance, luminous efficiency, and color coordinate The organic light emitting diodes according to Examples 4 to 6 and Comparative Example 1 were measured regarding driving voltage (V) and color coordinate to emit luminance of 1000 $cd/m^2$ by using a luminance meter (Minolta Cs-1000A) and regarding current efficiency (cd/A) and electrical power efficiency (lm/W) to emit the same luminance. The results are provided in Table 1.

2) Current density measurement depending on voltage change

Each organic light emitting diode according to Examples 4 to 6 and Comparative Example 1 was measured regarding current in a unit device by using a current-voltage device (Keithley 2400) while increasing its voltage from 0 V to 14 V. The current measurement was divided by an area to calculate current density. The result is provided in FIG. 9.

TABLE 1

| | Luminance at 1000 $cd/m^2$ | | | | |
| | Driving voltage | Current efficiency | Electrical power efficiency | Color coordinate CIE | |
| | (V) | (cd/A) | (lm/W) | x | y |
| Example 4 | 5.68 | 11.82 | 6.54 | 0.13 | 0.26 |
| Example 5 | 5.87 | 9.43 | 5.04 | 0.14 | 0.22 |
| Example 6 | 5.63 | 9.66 | 5.39 | 0.14 | 0.22 |
| Comparative Example 1 | 7.30 | 6.85 | 2.95 | 0.13 | 0.22 |

Figure 9:
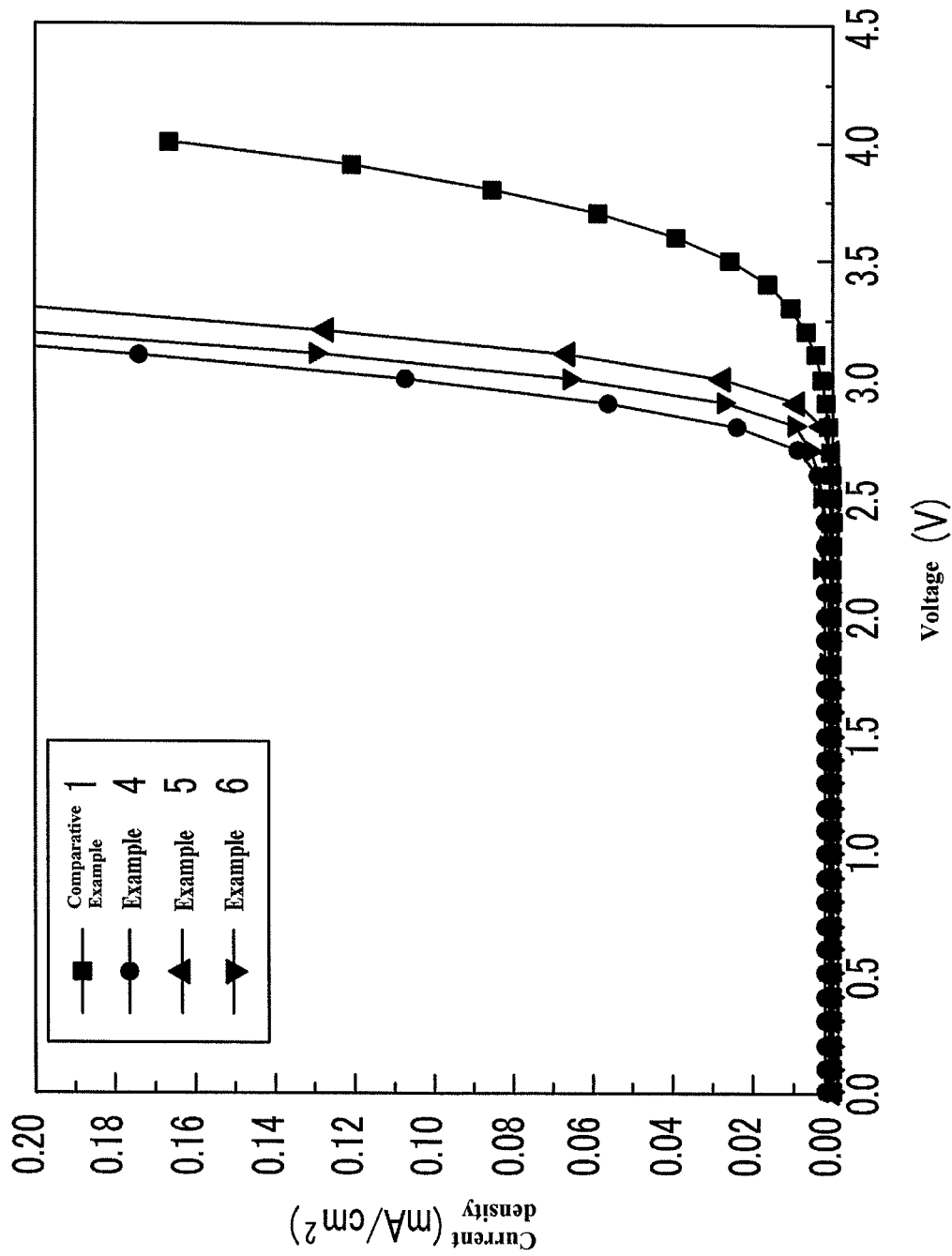
FIG. 9 illustrates voltage-current density characteristics of the organic light emitting diodes according to Examples 4 to 6 and Comparative Example 1.
Figure 12:
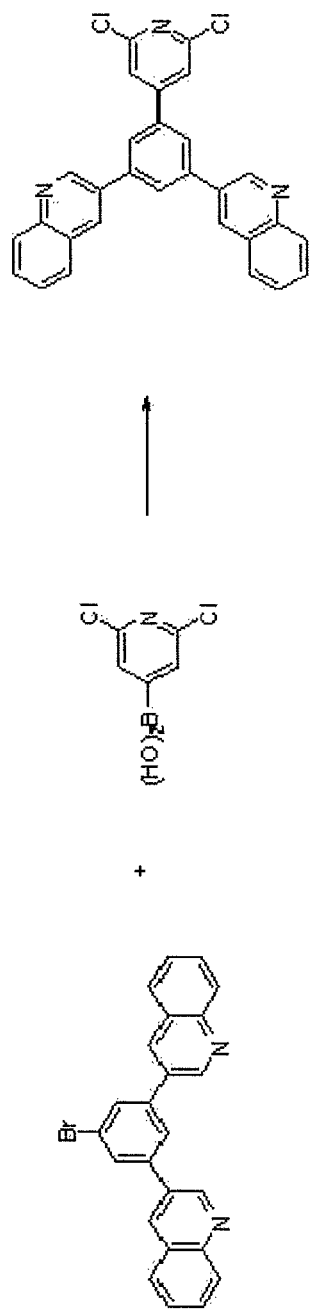
Figure 13:
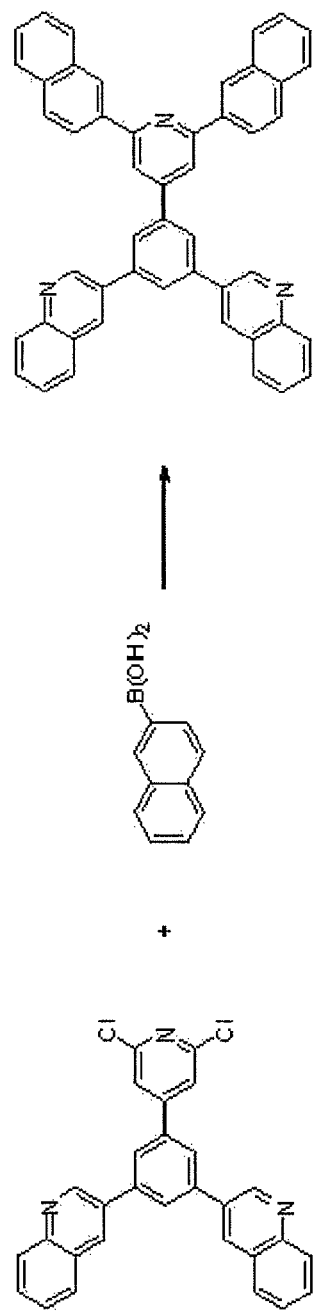
Figure 14:
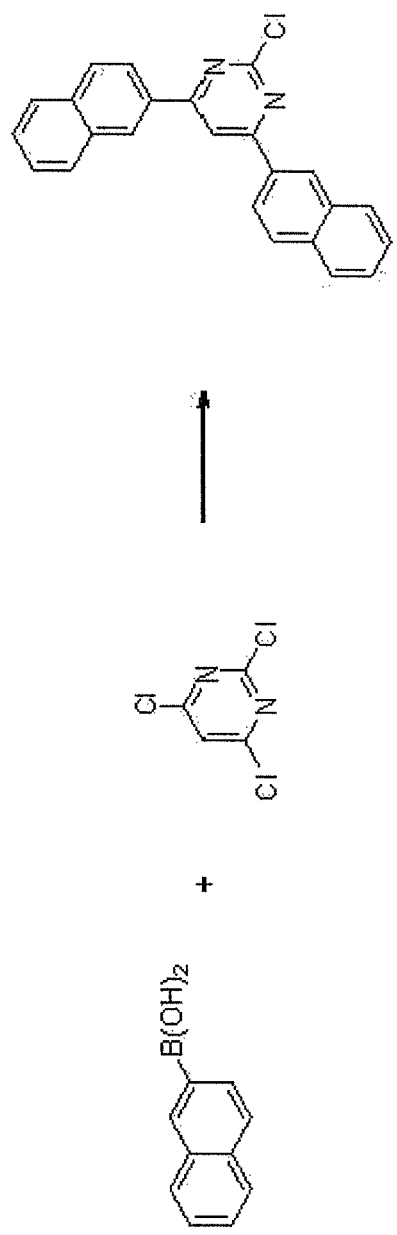
Figure 15:
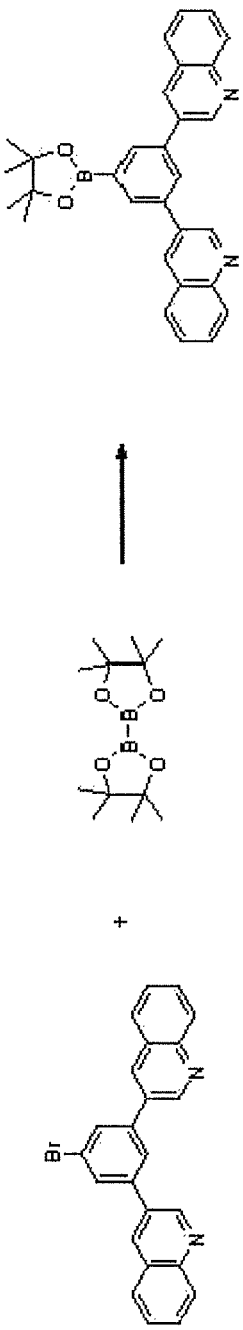
Figure 16:
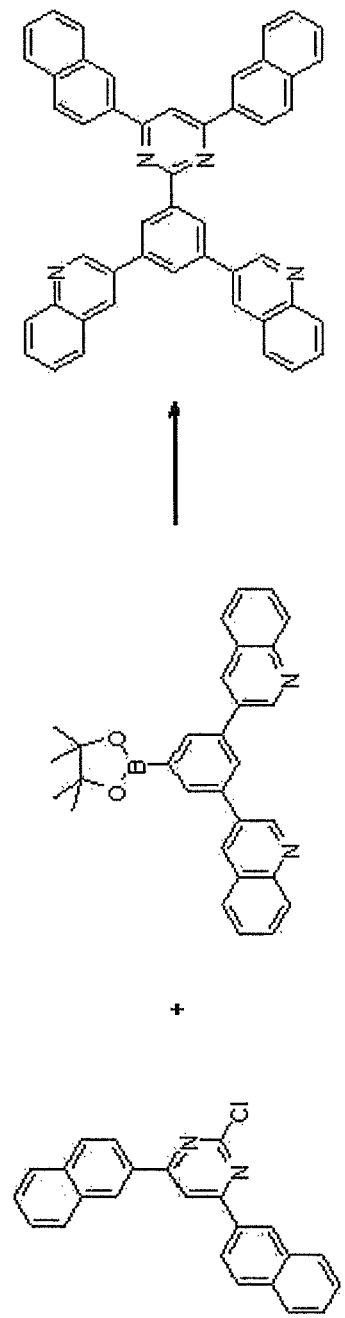
Figure 17:
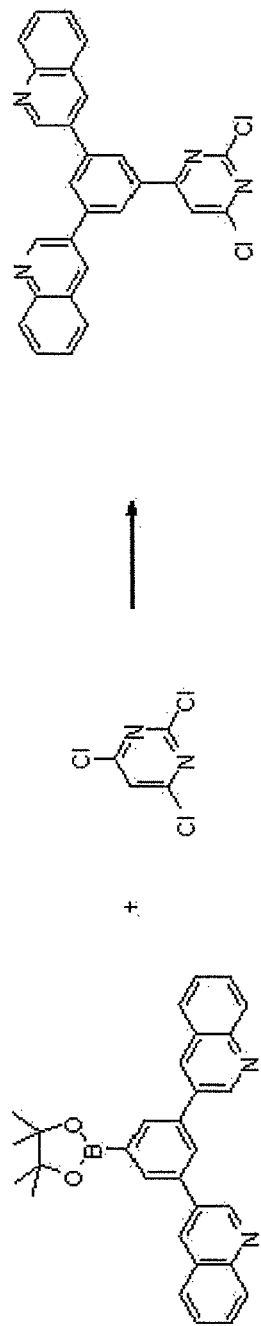
Figure 18:
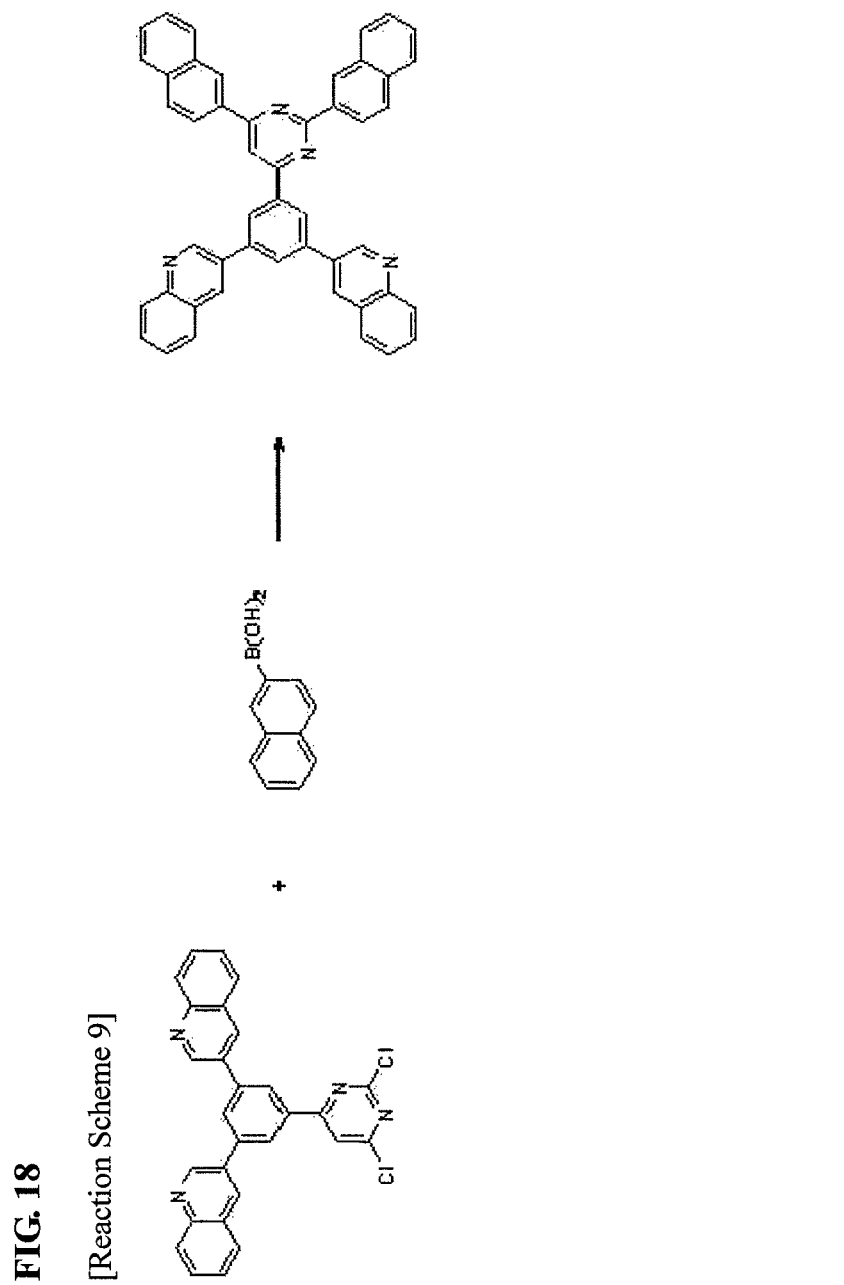

Referring to Table 1 and to FIG. 9, the organic light emitting diodes according to Examples 4 to 6 had a remarkably lower driving voltage than the one of Comparative Example 1. In addition, the organic light emitting diodes according to Examples 4 to 6 had remarkably low driving voltage but superbly high current efficiency and electric power efficiency.

Without being bound by theory, it is believed that these measurement results come from balance between holes and electrons in the emission layer. The compounds used in Examples 4 to 6 had excellent electron implant and transport characteristics compared with an electron transport material, Alq$_3$.

As described above, embodiments relate to a compound for an organic optoelectronic device being capable of providing an organic optoelectronic device having a low driving voltage, and excellent life-span and efficiency characteristics due to excellent hole and electron transport capability and thermal stability, and an organic light emitting diode including the same. A compound for an organic optoelectronic device of Chemical Formula 1 having excellent hole and electron transport capability and thermal stability is provided. The compound for an organic optoelectronic device may provide an organic optoelectronic device having a low driving voltage, and excellent life-span and efficiency.

By way of summation and review, a device may have a decreased life-span if the material therein crystallizes due to Joule heat generated when it is driven. The compound 2-(4-biphenylyl)-5-(4-t-butylphenyl)-1,3,4-oxadiazole (PBD) may not provide sufficient thermal stability and may crystallize when a device is driven. In addition, BCP and an aluminum mixed coordination complex (BAlq, bis(2-methyl-8-quinolinolate)-4-(phenylphenolate)aluminum), which may be used to lower hole mobility, may result in deterioration of the electron injection characteristic and may crystallize when a device is driven.

In order to increase the luminous efficiency, smooth combination between holes and electrons in an emission layer is desired. However, an organic material may have slower electron mobility than hole mobility. Thus, it may exhibit less efficient combination between holes and electrons, resulting in a decrease of luminous efficiency. An embodiment provides a compound for an organic optoelectronic device having excellent hole and electron transport capability. Another embodiment provides an organic light emitting diode having a low driving voltage, and excellent life-span and efficiency characteristics by including the compound for an organic optoelectronic device. Yet another embodiment provides a display including the organic light emitting diode.

The compound for an organic optoelectronic device according to an embodiment may provide improved hole and electron transport capability, with an energy level modified by the selected substituent(s). In an implementation, the compound for an organic optoelectronic device according to an embodiment has a structure where an aryl group and a heterocyclic group are sequentially repeated, which may lower an energy level and result in improvement of electron transport capability. The compound for an organic optoelectronic device according to an embodiment may be used in an organic thin layer of an emission layer, a hole transport layer (HTL), a hole injection layer (HIL), an electron transport layer (ETL), an electron injection layer (EIL), or a combination thereof, and may provide an organic optoelectronic device having excellent electrochemical and thermal stability and life-span, and high luminous efficiency at a low driving voltage.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound for an organic photoelectric device, the compound being represented by the following Chemical Formula 1:

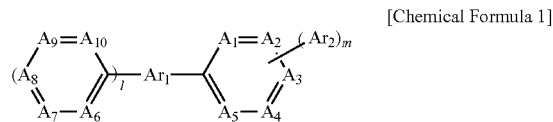

[Chemical Formula 1]

wherein, in Chemical Formula 1, $A_1$ to $A_{10}$ are each independently selected from the group of $CR_1$ to $CR_{10}$, $SiR_1$ to $SiR_{10}$, and N, wherein at least two adjacent ones of $R_6$ to $R_{10}$ are fused to each other to form an aromatic fused ring, provided that:

the ring including $A_1$ to $A_5$ is a pyridinylene ring in which exactly one of $A_1$ to $A_5$ is N, at least one of $A_6$ to $A_{10}$ is N, or at least one atom of the aromatic fused ring formed by fused ones of adjacent ones of $R_6$ to $R_{10}$ is N, and at least two of $A_6$ to $A_{10}$ are selected from the group of $CR_6$ to $CR_{10}$ and $SiR_6$ to $SiR_{10}$, $R_1$ to $R_{10}$ are each independently selected from the group of hydrogen, a halogen, a nitrile group, a cyano group, a nitro group, an amide group, a carbonyl group, an ester group, a substituted or unsubstituted alkyl group, a substituted or unsubstituted alkylene group, a substituted or unsubstituted alkoxy group, a substituted or unsubstituted alkenyl group, a substituted or unsubstituted alkenylene group, a substituted or unsubstituted alkynyl group, a substituted or unsubstituted alkynylene group, a substituted or unsubstituted cycloalkyl group, a substituted or unsubstituted cycloalkylene group, a substituted or unsubstituted aryl group, and a substituted or unsubstituted arylene group, $Ar_1$ is an unsubstituted arylene group or an arylene group substituted only with a halogen, a nitrile group, a cyano group, a nitro group, an amide group, a carbonyl group, an ester group, an alkyl group, an alkoxy group, an alkenyl group, an alkynyl group, a cycloalkyl group, an aryl group, or a combination thereof, $Ar_2$ is a substituted or unsubstituted aryl group, and l is an integer ranging from 2 to 4, and m is an integer ranging from 1 to 4, wherein each of the 2 to 4 l units are the same, and wherein, when m is 2 or more such that there are 2 or more m units, each of the 2 or more m units are the same or different.

2. The compound as claimed in claim 1, wherein l is 2 and m is 2, and the compound is represented by the following Chemical Formula 2:

[Chemical Formula 2]

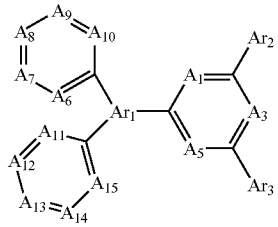

wherein, in Chemical Formula 2, $A_{11}$ to $A_{15}$ are each independently selected from the group of $CR_{11}$ to $CR_{15}$, $SiR_{11}$ to $SiR_{15}$, and N, wherein at least two adjacent ones of $R_{11}$ to $R_{15}$ are fused to each other to form an aromatic fused ring, provided that:

at least one of $A_{11}$ to $A_{15}$ is N, or at least one atom of the aromatic fused ring formed by fused ones of adjacent ones of $R_{11}$ to $R_{15}$ is N, and at least two of $A_{11}$ to $A_{15}$ are selected from the group of $CR_{11}$ to $CR_{15}$ and $SiR_{11}$ to $SiR_{15}$, $R_{11}$ to $R_{15}$ are each independently selected from the group of hydrogen, a halogen, a nitrile group, a cyano group, a nitro group, an amide group, a carbonyl group, an ester group, a substituted or unsubstituted alkyl group, a substituted or unsubstituted alkylene group, a substituted or unsubstituted alkoxy group, a substituted or unsubstituted alkenyl group, a substituted or unsubstituted alkenylene group, a substituted or unsubstituted alkynyl group, a substituted or unsubstituted alkynylene group, a substituted or unsubstituted cycloalkyl group, a substituted or unsubstituted cycloalkylene group, a substituted or unsubstituted aryl group, and a substituted or unsubstituted arylene group, and $Ar_3$ is a substituted or unsubstituted aryl group.

3. The compound as claimed in claim 2, wherein, in Chemical Formula 2, a substituent including $A_6$ to $A_{10}$ and a substituent including $A_{11}$ to $A_{15}$ are a quinolinyl group or an isoquinolinyl group.

4. The compound as claimed in claim 2, wherein, in Chemical Formula 2, $A_3$ is N, and a substituent including $A_6$ to $A_{10}$ and a substituent including $A_{11}$ to $A_{15}$ are a quinolinyl group or an isoquinolinyl group.

5. The compound as claimed in claim 4, wherein the quinolinyl group or isoquinolinyl group is bound with $Ar_1$ at a No. 2 or 3 position of the quinolinyl group or isoquinolinyl group.

6. The compound as claimed in claim 1, wherein $Ar_2$ is a C6 to C50 aryl.

7. The compound as claimed in claim 1, wherein the compound is a compound selected from the following Chemical Formulae 18, 23, 28, 34, 38, 43, and 48:

[Chemical Formula 18]

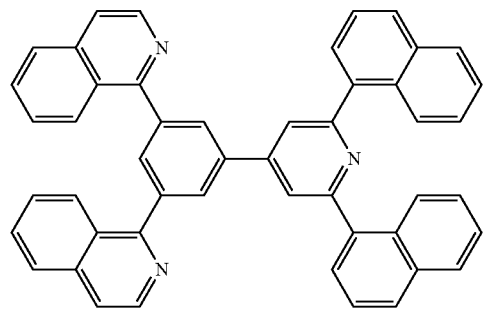

[Chemical Formula 23]

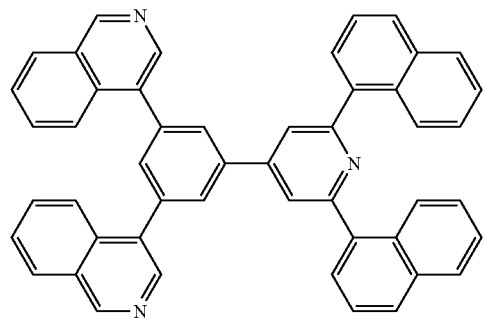

[Chemical Formula 28]

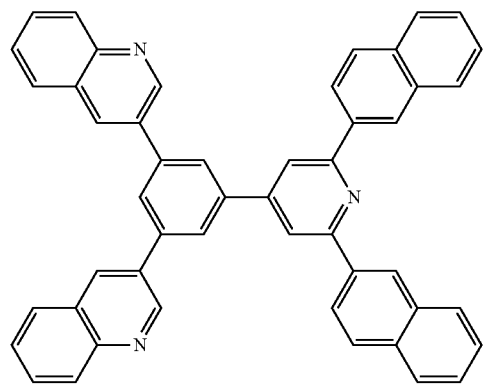

[Chemical Formula 34]

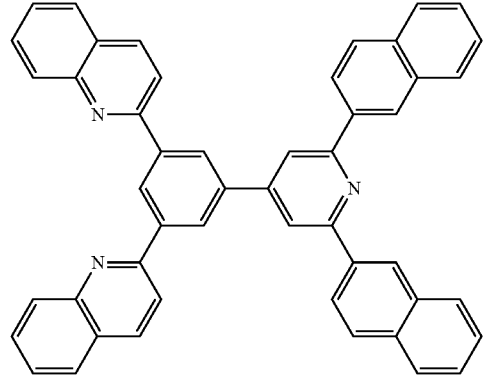

[Chemical Formula 38]
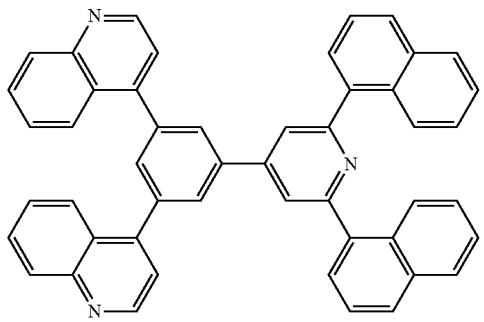
[Chemical Formula 43]
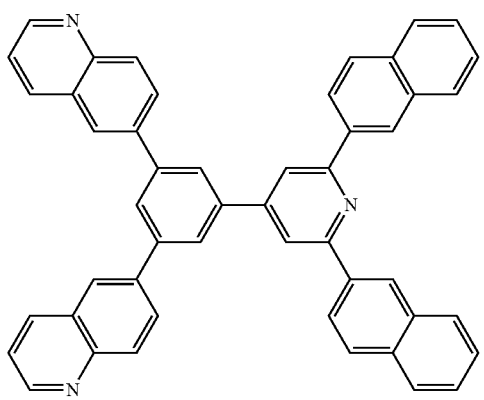
[Chemical Formula 48]
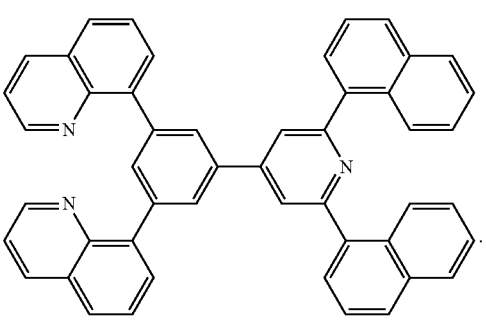
8. The compound as claimed in claim 1, wherein the compound is a compound selected from the following Chemical Formulae 19, 24, 29, 35, 39, 44, and 49:
[Chemical Formula 19]
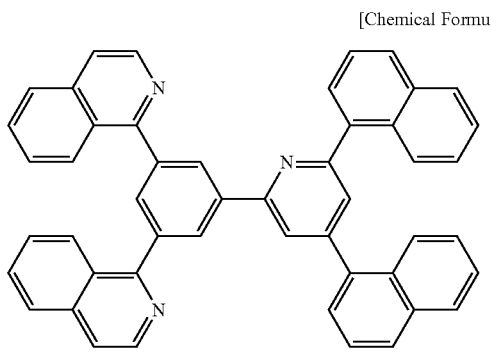
[Chemical Formula 24]
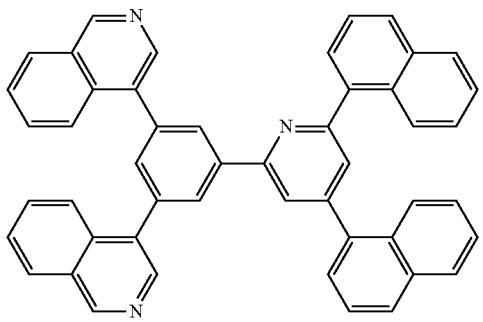
[Chemical Formula 29]
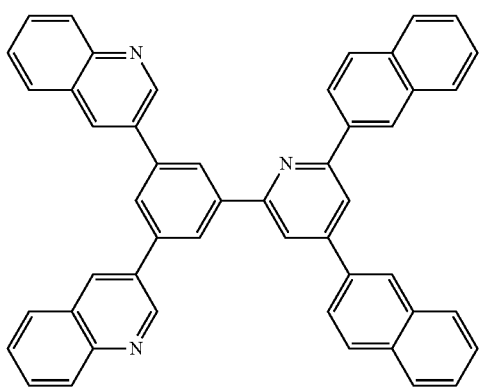
[Chemical Formula 35]
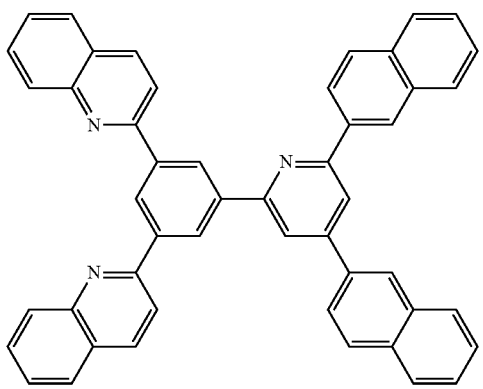
[Chemical Formula 39]
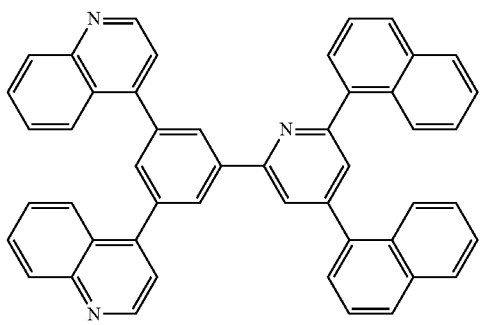

[Chemical Formula 44]

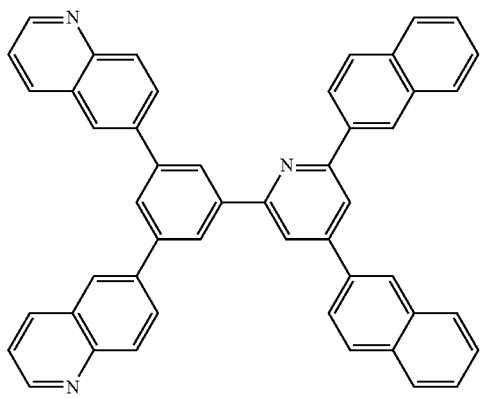

[Chemical Formula 49]

9. An organic photoelectric device, comprising:
an anode, a cathode, and at least one organic thin layer between the anode and the cathode, the at least one organic thin layer including the compound as claimed in claim 1.

10. The organic photoelectric device of claim 9, wherein the compound is a host material or a charge transport material.

11. The organic photoelectric device of claim 9, wherein the at least one organic thin layer includes at least one of an emission layer, a hole transport layer, a hole injection layer, an electron transport layer, an electron injection layer, and a combination thereof.

12. The organic photoelectric device of claim 9, wherein the at least one organic thin layer includes a layer that includes the compound and a reducing dopant.

13. The organic photoelectric device of claim 12, wherein the reducing dopant is selected from the group of an alkali metal, an alkali earth metal, a rare earth element metal, an oxide of an alkali metal, a halide of an alkali metal, an organic complex of an alkali metal, an oxide of an alkali earth metal, a halide of an alkali earth metal, an organic complex of an alkali earth metal, an oxide of a rare earth element metal, a halide of a rare earth element metal, and an organic complex of a rare earth element metal.

14. A display device comprising the organic photoelectric device as claimed in claim 9.

15. The compound as claimed in claim 1, wherein, in Chemical Formula 1, $Ar_1$ is an unsubstituted arylene group.

* * * * *